(12) United States Patent
Sawahata

(10) Patent No.: US 8,860,139 B2
(45) Date of Patent: Oct. 14, 2014

(54) ESD PROTECTION ELEMENT

(75) Inventor: Kouichi Sawahata, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 656 days.

(21) Appl. No.: 12/722,000

(22) Filed: Mar. 11, 2010

(65) Prior Publication Data

US 2010/0230719 A1   Sep. 16, 2010

(30) Foreign Application Priority Data

Mar. 11, 2009   (JP) ................................ 2009-058465
Feb. 17, 2010   (JP) ................................ 2010-032190

(51) Int. Cl.
*H01L 21/8222*   (2006.01)
*H01L 21/8228*   (2006.01)
*H01L 27/02*   (2006.01)
*H01L 27/102*   (2006.01)

(52) U.S. Cl.
CPC ........ *H01L 27/0259* (2013.01); *H01L 27/0292* (2013.01)
USPC ............ 257/355; 257/358; 257/362; 257/577; 257/E27.037; 438/323; 438/324; 438/330

(58) Field of Classification Search
CPC ............ H01L 27/0248; H01L 27/0251; H01L 27/0259; H01L 27/0262; H01L 27/0292
USPC ......... 257/355, 358, 361–363, 539, 542, 565, 257/566, 574–577, 579–582, E31.069, 257/E27.037, E27.043, E27.106, 257/E29.03–E29.031, E29.034, 257/E29.044–E29.045; 438/309, 314, 438/322–327, 330–332, 340
See application file for complete search history.

(56) References Cited

U.S. PATENT DOCUMENTS

| 4,763,184 | A | * | 8/1988 | Krieger et al. ................ 257/362 |
| 4,811,155 | A |   | 3/1989 | Kuriyama et al. |
| 4,918,563 | A | * | 4/1990 | Kanai et al. ..................... 361/56 |
| 5,237,481 | A | * | 8/1993 | Soo et al. ....................... 361/103 |
| 5,428,498 | A |   | 6/1995 | Hawkins et al. |

(Continued)

FOREIGN PATENT DOCUMENTS

| JP | S63-172454 A | 7/1988 |
| JP | H06-125040 A | 5/1994 |

(Continued)

OTHER PUBLICATIONS

Ming-Dou Ker; Kun-Hsien; The Impact of Low-Holding-Voltage Issue in High-Voltage CMOS Technology andthe Design of Latchup-Free Power-Rail ESD Clamp Circuit for LCD Driver ICs; IEEE Journal of Solid-State Circuits, vol. 40, No. 8, Aug. 2005, pp. 1751-1759.

(Continued)

Primary Examiner — William F Kraig
Assistant Examiner — Maliheh Malek
(74) Attorney, Agent, or Firm — Sughrue Mion, PLLC

(57) ABSTRACT

In an aspect of the present invention, an ESD (Electrostatic Discharge) protection element includes a bipolar transistor comprising a collector diffusion layer connected with a first terminal and an emitter diffusion layer; and current control resistances provided for a plurality of current paths from a second terminal to the collector diffusion layer through the emitter diffusion layer, respectively. The bipolar transistor further includes a base diffusion region connected with the second terminal through a first resistance which is different from the current control resistances.

30 Claims, 30 Drawing Sheets

(56) References Cited

U.S. PATENT DOCUMENTS

| | | | |
|---|---|---|---|
| 5,532,901 A | 7/1996 | Hawkins et al. | |
| 5,548,134 A * | 8/1996 | Tailliet | 257/173 |
| 5,591,992 A * | 1/1997 | Leach | 257/173 |
| 5,710,452 A * | 1/1998 | Narita | 257/355 |
| 5,744,842 A * | 4/1998 | Ker | 257/362 |
| 5,773,873 A * | 6/1998 | Kuriyama | 257/563 |
| 5,828,107 A * | 10/1998 | Narita | 257/363 |
| 6,429,505 B1 * | 8/2002 | Kunikiyo | 257/577 |
| 6,441,437 B1 * | 8/2002 | Gossner | 257/355 |
| 6,512,662 B1 * | 1/2003 | Wang | 361/56 |
| 6,750,517 B1 * | 6/2004 | Ker et al. | 257/401 |
| 6,858,901 B2 * | 2/2005 | Ker et al. | 257/360 |
| 7,098,510 B2 * | 8/2006 | Kodama et al. | 257/355 |
| 7,332,748 B2 * | 2/2008 | Kodama et al. | 257/107 |
| 7,358,572 B2 * | 4/2008 | Voldman | 257/360 |
| 7,440,248 B2 * | 10/2008 | Arai et al. | 361/56 |
| 7,714,356 B2 * | 5/2010 | Abou-Khalil et al. | 257/173 |
| 7,826,185 B2 * | 11/2010 | Abou-Khalil et al. | 361/56 |
| 2002/0058375 A1 * | 5/2002 | Kurokawa et al. | 438/235 |
| 2002/0117684 A1 * | 8/2002 | Kurokawa et al. | 257/197 |
| 2002/0135045 A1 * | 9/2002 | Ito et al. | 257/566 |
| 2002/0153571 A1 * | 10/2002 | Mergens et al. | 257/358 |
| 2004/0051146 A1 * | 3/2004 | Ker et al. | 257/356 |
| 2004/0164354 A1 * | 8/2004 | Mergens et al. | 257/355 |
| 2004/0164356 A1 * | 8/2004 | Josef Mergens et al. | 257/360 |
| 2004/0207021 A1 * | 10/2004 | Russ et al. | 257/355 |
| 2005/0029540 A1 * | 2/2005 | Kodama et al. | 257/173 |
| 2005/0051847 A1 * | 3/2005 | Tsuji et al. | 257/355 |
| 2005/0073009 A1 * | 4/2005 | Kojima et al. | 257/362 |
| 2005/0083618 A1 * | 4/2005 | Steinhoff et al. | 361/56 |
| 2005/0161707 A1 * | 7/2005 | Dikken | 257/213 |
| 2005/0207077 A1 * | 9/2005 | Xu et al. | 361/56 |
| 2005/0242400 A1 * | 11/2005 | Cheng et al. | 257/355 |
| 2005/0269641 A1 * | 12/2005 | Lai et al. | 257/355 |
| 2006/0097322 A1 * | 5/2006 | Kwak et al. | 257/355 |
| 2006/0214234 A1 * | 9/2006 | Nagatomo | 257/355 |
| 2006/0267148 A1 * | 11/2006 | Ma et al. | 257/566 |
| 2007/0228412 A1 * | 10/2007 | Yang et al. | 257/173 |
| 2007/0246737 A1 * | 10/2007 | Chang | 257/107 |
| 2008/0013234 A1 * | 1/2008 | Takahashi | 361/56 |
| 2008/0237721 A1 * | 10/2008 | Abou-Khalil et al. | 257/360 |
| 2008/0277689 A1 * | 11/2008 | Kodama et al. | 257/173 |
| 2008/0316659 A1 * | 12/2008 | Oguzman et al. | 361/56 |
| 2009/0108289 A1 * | 4/2009 | Abou-Khalil et al. | 257/173 |
| 2009/0315146 A1 * | 12/2009 | Vashchenko | 257/579 |
| 2010/0032714 A1 * | 2/2010 | Takahashi | 257/173 |
| 2010/0118454 A1 * | 5/2010 | Ker et al. | 361/56 |
| 2010/0193869 A1 * | 8/2010 | Habasaki | 257/360 |
| 2011/0006341 A1 * | 1/2011 | Sawahata | 257/143 |
| 2011/0284963 A1 * | 11/2011 | Yabu et al. | 257/355 |
| 2012/0032228 A1 * | 2/2012 | Sawahata et al. | 257/173 |
| 2013/0062697 A1 * | 3/2013 | Okushima | 257/355 |

FOREIGN PATENT DOCUMENTS

| | | |
|---|---|---|
| JP | H11-111727 A | 4/1999 |
| JP | 2000-101026 A | 4/2000 |
| JP | 6587320 B1 | 7/2003 |
| JP | 2007-012648 A | 1/2007 |

OTHER PUBLICATIONS

Markus P.J. Mergens, Michael T. Mayerhofer, Joost A. Willemen, Matthias Stecher; ESD Protection Considerations in Advanced High-Voltage Technologies for Automotive; Infineon Technologies AG, Munich, Germany; pp. 06-54-06-63, Sep. 2006.

Notification of Reasons for Refusal dated Dec. 20, 2013 issued by the Japanese Patent Office in counterpart Japanese Patent Application No. 2010-032190.

* cited by examiner

ESD PROTECTION ELEMENT

INCORPORATION BY REFERENCE

This application claims priorities on convention based on Japanese Patent Application Nos. 2009-058465 and 2010-032190. The disclosure thereof is incorporated herein by reference.

TECHNICAL FIELD

The present invention relates to an ESD (Electrostatic Discharge) protection element for protecting an internal circuit from ESD, and in particular, relates to an ESD protection element using a bipolar transistor.

BACKGROUND ART

In recent years, it is demanded to improve reliability of a semiconductor integrated circuit used in various fields. Particularly high reliability is demanded in a semiconductor integrated circuit used for a product which affects human life resulting from a failure, as in a driver circuit for a liquid crystal monitor used in a car navigation system and in a medical field. For the purpose of such high product reliability, one of schemes to be required is to strong endurance to an overvoltage (or ESD) applied from the outside. That is, an integrated circuit with high ESD endurance is demanded.

In order to enhance ESD endurance in an LSI (Large Scale Integration), a protection element against ESD (i.e. ESD protection element) is generally provided between an internal circuit of an LSI and input/output pad. The ESD protection element prevents the internal circuit of LSI from being destroyed by changing a path for a surge current generated by ESD.

Generally, an MOSFET (Metal-Oxide-Semiconductor Field-Effect Transistor), a bipolar transistor and a thyristor are used as the ESD protection elements. For example, the ESD protection element using an NPN bipolar transistor is disclosed in "ESD Protection Considerations in Advanced High-Voltage Technologies for Automotive", and IEEE JOURNAL OF SOLID-STATE CIRCUITS, VOL. 40, No. 8, AUGUST 2005 P. 1751.

Referring to FIGS. 1 to 3, a conventional ESD protection element using a bipolar transistor will be described. FIG. 1 is a cross sectional view showing a sectional structure of the conventional ESD protection element along A-A' shown in FIG. 2. FIG. 2 is a plan view showing a structure of the conventional ESD protection element. FIG. 3 shows an equivalent circuit of the conventional ESD protection circuit.

Referring to FIG. 1, in the conventional ESD protection element, and an N⁻ embedded layer (NBL) 102 is formed on a P-type substrate (P-sub) 101 in a Z-axis direction, and an N⁻ collector region 103 and an N⁺ lead-out region 105 are formed on the N⁻ embedded layer (NBL) 102. A P⁻ base region 104 is formed on the N⁻ collector region 103 to function as a base region. a high-concentration P⁺ diffusion layer 87 (to be referred to as P⁺ base diffusion layer 87, hereinafter) and a contact 84 which function as a base electrode B20 and a high-concentration N⁺ diffusion layer 88 (to be referred to as N⁺ emitter diffusion layer 88 hereinafter) and a contact 85 which function as an emitter electrode E10 are provided on the P⁻ base region 104. Also, a high-concentration N⁺ diffusion layer 89 (to be referred to as N⁺ collector diffusion layer 89) and a contact 86 which function as a collector electrode C10 are provided on the N⁺ lead-out region 105. The P⁺ base diffusion layer 87, the N⁺ emitter diffusion layer 88 and the N⁺ collector diffusion layer 89 are separated from each other by an element separation region 106.

Referring to FIG. 2, the P⁺ base diffusion layer 87 is connected to a grounded metal wiring 81 via a plurality of the contacts 84 arranged in a direction of a base width W (or in a Y-axis direction). The N⁺ emitter diffusion layer 88 is connected to the grounded metal wiring 81 via a plurality of the contacts 85 arranged in the base width W direction (or in the Y-axis direction). Similarly, the N⁺ collector diffusion layer 89 is connected to a pad via a plurality of the contacts 86 arranged in the direction base width W (or in the Y-axis direction) and a metal wiring 82. The pad is connected to an internal circuit (not shown).

Referring to FIGS. 1 to 3, a region of the P⁻ well 104 which is straightly below the N⁺ emitter diffusion layer 88 is referred to as a base region B10. When a high voltage is applied to the pad due to ESD, a breakdown occurs in a junction between the base region B10 and the collector terminal C10, and holes generated in the vicinity of the junction flow into the base terminal B20 and electrons generated in the vicinity of the junction flow into the collector electrode C10. At this time, a voltage in the base region B10 (i.e. base voltage) increases based on a voltage drop generated by a parasitic resistance $R_B$ between the base region B10 and the base electrode B20. A diode between the emitter electrode E10 and the base region B10 is turned on through increase of the base voltage and a surge current due to ESD starts flowing between the collector electrode C10 and the emitter electrode E10. Thus, it is possible to prevent the surge current due to ESD from flowing into the internal circuit.

When the ESD surge current flows from the collector electrode C10 to the emitter electrode E10 in the bipolar transistor, heat is generated with an electric field which is present in a depletion layer generated in a junction breakdown region (i.e. in the vicinity of a junction region between the collector and the base or in the vicinity of a boundary between the embedded collector layer and the base) and a current due to flow of electrons from the emitter electrode E10 to the depletion layer. Meanwhile, since the plurality of the contacts 85 and 86 are arranged in the base width W direction (or in the Y-axis direction shown in FIG. 2), a plurality of current paths are present between the collector and the emitter. A current amount is not uniform between the plurality of current paths but varies in the base width W direction (or in the Y-axis direction). That is, a region in which a large surge current flows and a region in which a small surge current flows appear between the collector and the emitter. The region with the large current amount is accompanied by a high temperature, compared with the region with the small current amount, and as a result of this, carriers increase to reduce a resistance of the region, resulting in a further larger current to flow. For example, referring to FIG. 2, a larger amount of surge current flows in a region with a current amount and temperature locally increased more than other regions. If a current is concentrated locally in this way, element destruction is easy to occur in the region, which leads reduction of ESD endurance in an ESD protection element as a whole.

In addition, U.S. patent (U.S. Pat. No. 6,587,320 B1) is known as a prior art.

As described above, in the conventional ESD protection element, element destruction occurs because of current concentration (or thermal runaway) due to deviation in a current density in the base width W direction (or in the Y-axis direction), whereby ESD endurance is reduced.

SUMMARY OF THE INVENTION

In an aspect of the present invention, an ESD (Electrostatic Discharge) protection element includes a bipolar transistor comprising a collector diffusion layer connected with a first terminal and an emitter diffusion layer; and current control resistances provided for a plurality of current paths from a second terminal to the collector diffusion layer through the emitter diffusion layer, respectively.

In another aspect of the present invention, an ESD (Electrostatic Discharge) protection element includes a bipolar transistor comprising a collector diffusion region connected with a first terminal and an emitter diffusion region; and current control resistances provided for a plurality of current paths from a second terminal to the collector diffusion region through the emitter diffusion region, respectively.

An ESD protection element according to the present invention makes it possible to enhance an ESD resistance.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, an ESD (Electrostatic Discharge) protection element of the present invention will be described in detail with reference to the attached drawings. In the embodiments described below, the ESD protection element using a bipolar transistor for preventing ESD destruction of an internal circuit (not shown) will be described.

[First Embodiment]

Figure 1:
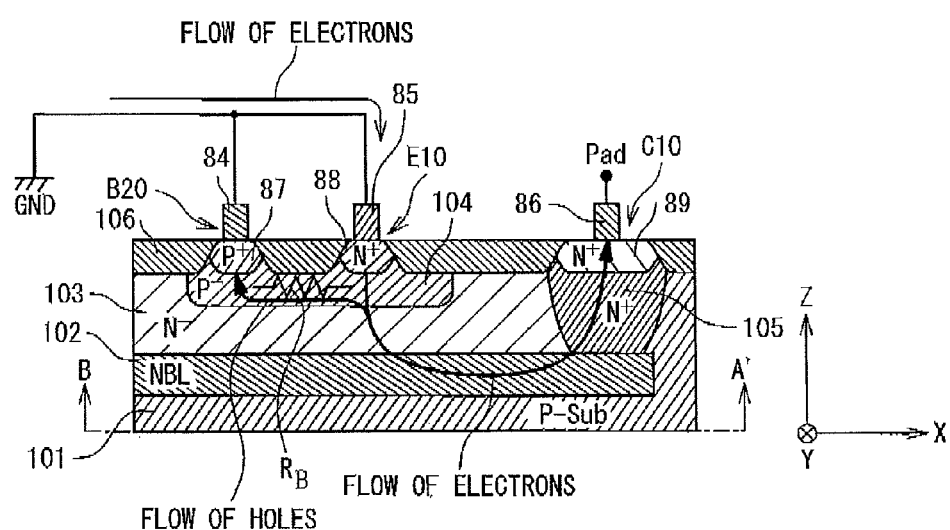
FIG. 1 is a cross sectional view showing a structure of a conventional ESP protection element along A-A' shown in FIG. 2.
Figure 2:
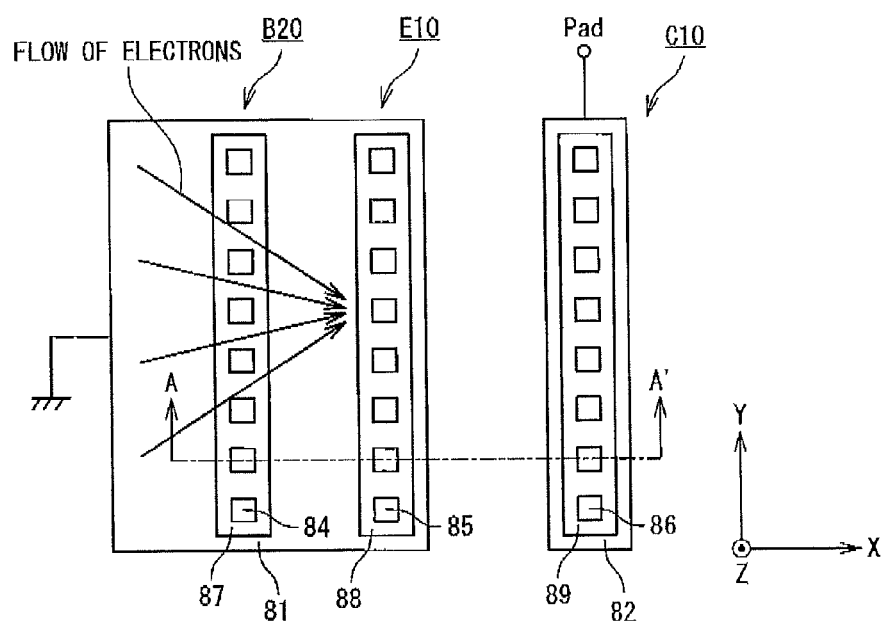
FIG. 2 is a plan view showing a structure of the conventional ESD protection element.
Figure 3:
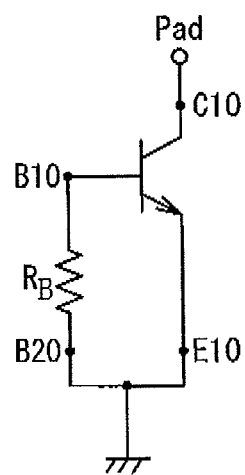
FIG. 3 shows an equivalent circuit of the conventional ESD protection element.
Figure 4:
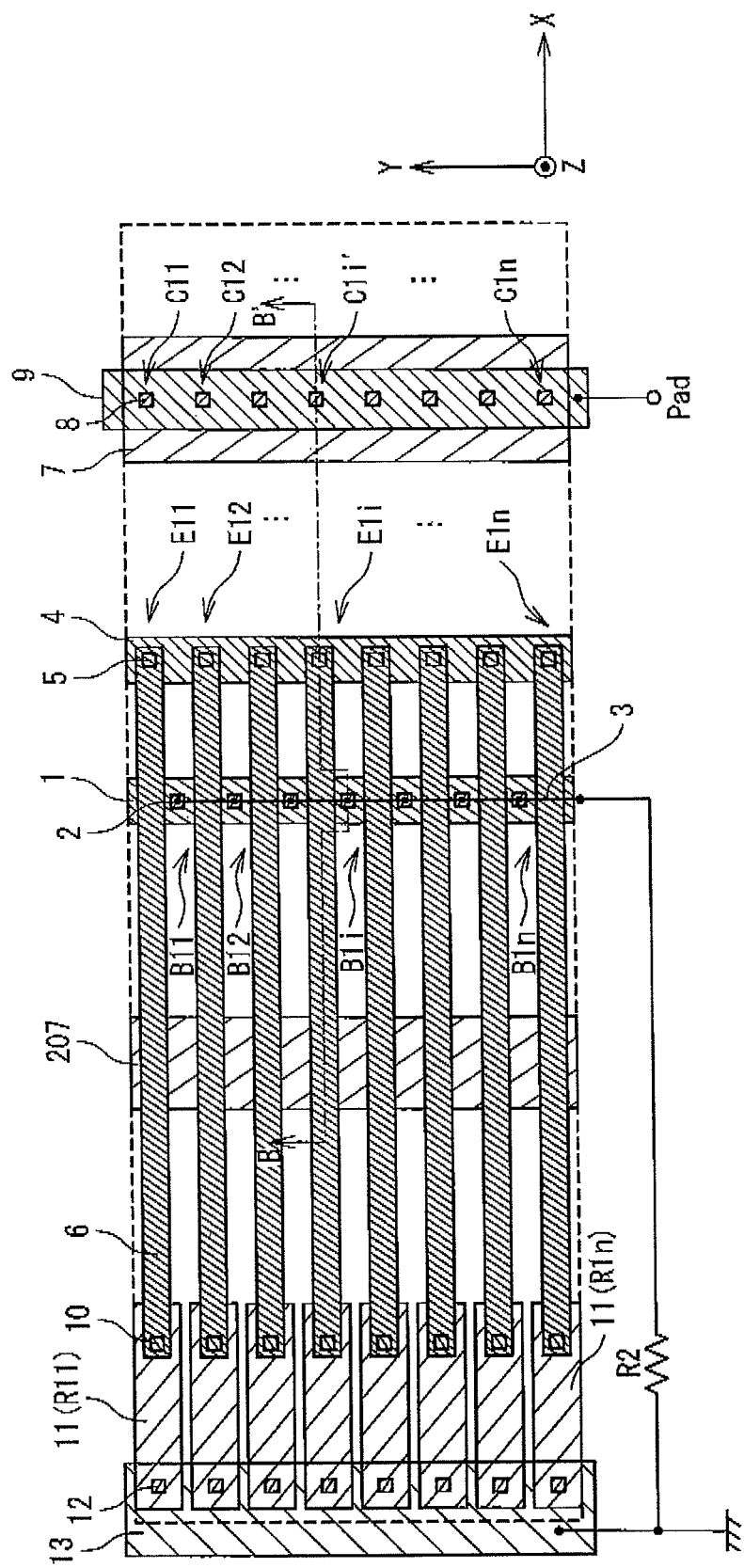
FIG. 4 is a plan view showing a structure of an ESD protection element according to a first embodiment of the present invention.
Figure 5:
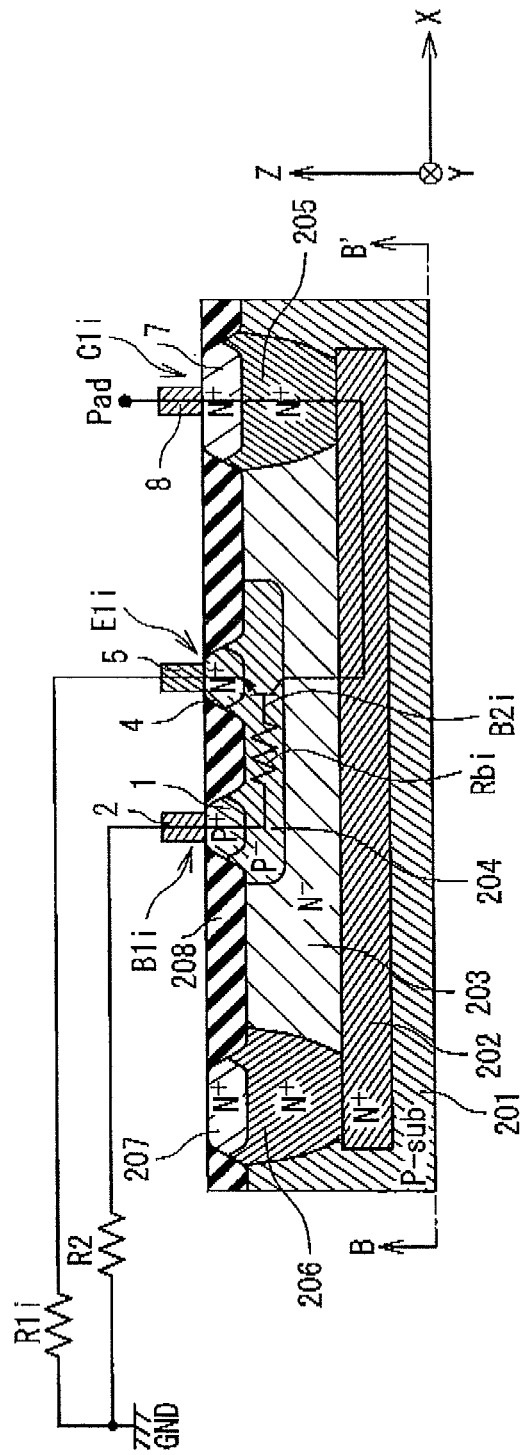
FIG. 5 is a cross sectional view showing the structure of the ESD protection element according to the first embodiment of the present invention along B-B' shown in FIG. 4.
Figure 6:
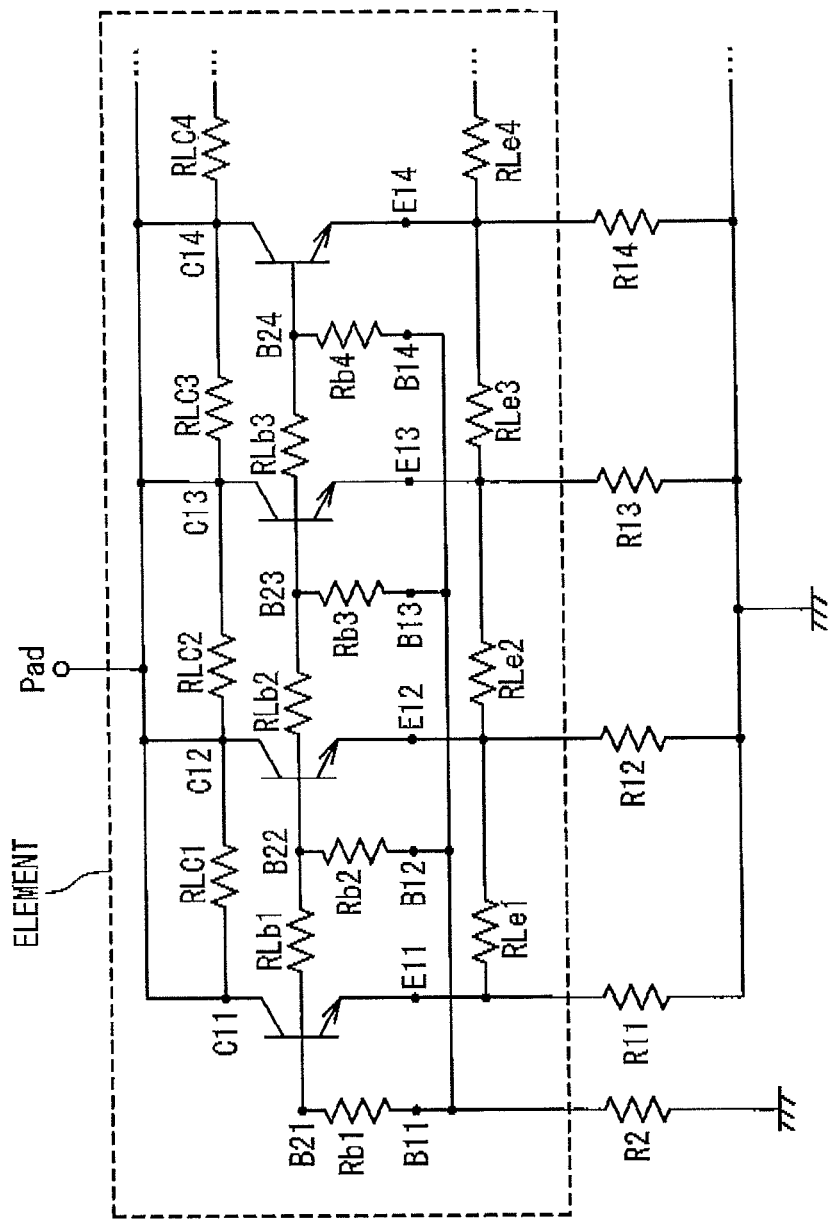
FIG. 6 shows an equivalent circuit of the ESD protection element according to the first embodiment of the present invention.

Referring to FIGS. 4 to 6, a structure and operation of the ESD protection element according to a first embodiment of the present invention will be described. FIG. 4 is a plan view showing a structure of the ESD protection element according to the first embodiment of the present invention. FIG. 5 is a cross sectional view showing a structure of the ESD protection element in the first embodiment along B-B' shown in FIG. 4. FIG. 6 shows an equivalent circuit of the ESD protection element in the first embodiment.

Referring to FIG. 4, the ESD protection element in the first embodiment has a high-concentration $P^+$ diffusion layer 1 (to be referred to as a $P^+$ base diffusion layer 1 hereinafter) which functions as a base of the bipolar transistor, a high-concentration $N^+$ diffusion layer 4 (to be referred to as an $N^+$ emitter diffusion layer 4 hereinafter) which functions as an emitter thereof, and an N+ diffusion layer 7 (to be referred to as an N+ collector diffusion layer 7 hereinafter) which functions as a collector thereof.

The P+ base diffusion layer 1 is connected to a common metal wiring 3 via a plurality of contacts 2 arranged in a base width W direction (or in a Y-axis direction). The metal wiring 3 is connected to a power supply voltage (e.g. ground (GND) voltage) via a resistor R2. Thus, the plurality of contacts 2 function as a base electrode B1 to be commonly grounded via the resistor R2.

The N+ emitter diffusion layer 4 is connected to a plurality of metal wirings 6 via a plurality of contacts 5 arranged in the base width W direction (or in the Y-axis direction). The plurality of metal wirings 6 are respectively connected to one ends of a plurality of current control resistors 11 (R11 to R1n; represented as R1i) via a plurality of contacts 10. The other ends of the plurality of current control resistors 11 (R1i) are respectively connected to a common metal wiring 13 via a plurality of contacts 12. The metal wiring 13 is connected to the power supply voltage (e.g. ground (GND) voltage). The plurality of contacts 5 function as emitter terminals E11 to E1n which are grounded via the current control resistors 11 (R1i). It is preferable that polysilicon layers or diffusion layers are used for the current control resistors 11.

The N+ collector diffusion layer 7 is connected to a pad via a metal wiring 9 and a plurality of contacts 8 arranged in the base width W direction (or in the Y-axis direction). The pad is connected to the internal circuit (not shown). The plurality of contacts 8 function as collector terminals C1 to be commonly connected to the pad.

Each of The P+ base diffusion layer 1 and the N+ emitter diffusion layer 4 in the first embodiment is formed to extend in the base width W direction (or in the Y-axis direction).

FIG. 5 shows a cross sectional structure of the ESD protection element along B-B' shown in FIG. 4. It should be noted that a structure of the wiring layers is omitted in FIG. 5. Referring to FIG. 5, in the ESD protection element in the first embodiment, an N+ embedded layer, 202 is formed on a P-type substrate (i.e. P-sub) 201 in a Z-axis direction, and N+ lead-out regions 205 and 206 and an N− collector region 203 are formed on the embedded layer 202. The N− collector region 203 is formed between the N+ lead-out regions 205 and 206, and a P− base region 204 is formed on the N− collector region 203 in the Z-axis direction to function as a base region.

The P+ base diffusion layer 1 and the contacts 2 as the base terminals B1i (B11 to B1n) are formed on the P− base region 204, and the high-concentration N+ diffusion layer 4 (to be referred to as the N+ emitter diffusion layer 4 hereinafter) and the contacts 5 as the emitter terminals E1i (E11 to E1n) are formed on the P− base region 204, The high-concentration N+ diffusion layer 7 (to be referred to as the N+ collector diffusion layer 7 hereinafter) and the contacts 8 as the collector terminals C1i (C11 to C1n) are formed on the N+ lead-out region 205. Further, a high-concentration N+ diffusion layer 207 is formed on the N+ lead-out region 206. The N+ diffusion layer 207, the P+ base diffusion layer 1, the N+ emitter diffusion layer 4 and the N+ collector diffusion layer 7 are separated from each other by an element separation region 208 (e.g. insulating film).

The base terminal B1i is connected to the resistor R2 by the common metal wiring 3 as well as the other base terminals B1 formed on the same P− base diffusion layer 1. Similarly, the collector terminal C1i is connected to the pad via a common metal wiring 9 as well as the other collector terminals C1 formed on the N+ collector diffusion layer 7. Meanwhile, the emitter terminal E1i is connected to the metal wiring 6 and the current control resistor 11 which are different from those used for other emitter electrodes E1 formed on the same N+ emitter diffusion layer 4.

Moreover, if a high voltage is applied to the pad so that a breakdown occurs in a junction between the P− base region 204 and the N− collector region 203, a hole current generated through the breakdown flows into a base region (i.e. base region B2i) below the emitter electrode E1i and flows out to the power supply voltage (e.g. ground (GND) voltage) via the contacts 2. At this time, a resistance Rbi, i.e. a resistance component of the P− base region 204 from the base region B2i to the P+ base diffusion layer 1 functions as a resistance for increasing a base voltage (i.e. voltage of the base region B2i).

FIG. 6 shows an equivalent circuit according to the present embodiment. In the equivalent circuit of FIG. 6, for appropriate explanation of an operation of the ESD protection element in the present embodiment, the ESD protection element is assumed to include a plurality of bipolar transistors. Describing the ESD protection element with reference to FIG. 6, the ESD protection element in the first embodiment includes a plurality of NPN bipolar transistors having the emitter terminals E11 to E1n, the base regions B21 to B2n, and the collector terminals C11 to C1n.

Referring to FIGS. 4 to 6, the emitter terminals E11 to E1n are arranged commonly on the N+ emitter diffusion layer region and connected by diffusion layer resistances. Therefore, resistances RLe1 to RLe(n−1) are formed from the N+ emitter diffusion layer 4 between the emitter terminals E11 to E1n. Similarly, resistances RLb1 to RLb(n−1) are formed from the P− base region 204 between the base regions B21 to B2n below the emitter terminals E11 to E1n. The collector terminals C11 to C1n are connected commonly by the N+ embedded layer 202 and the N+ lead-out regions 205 and 206. Therefore, resistances RLC1 to RLC(n−1) are formed from the N+ embedded layer 202 and the N+ lead-out regions 205 and 206 between the collector terminals C11 to C1n. Further, the resistances Rb1 to Rbn are formed from the P− base region 204 between the base regions B21 to B2n and the base terminals B11 to B1n.

As described above, the plurality of transistors are separated from each other by the resistances RLC1 to RLC(n−1), the resistances RLb1 to RLb(n−1) and the resistances RLe1 to RLe(n−1). Therefore, current paths of a surge current flowing through the plurality of transistors are separated from each other. The current control resistors R11 to R1n are connected to the emitter terminals E11 to E1n, respectively. From the above configuration, a current (i.e. surge current) flowing to the power supply voltage (e.g. ground (GND) voltage) is distributed into the current control resistors R11 to R1n. Thus, current concentration into a specific emitter terminal E1i can be avoided.

Next, an operation of the ESD protection element in the first embodiment will be described.

When a high voltage pulse due to ESD is applied to the pad, a voltage rapidly increases in the N+ collector diffusion layer 7 and the N+ lead-out region 205. At this time, breakdown occurs in a junction between the P− base region 204 and the N− collector region 203, and a current generated through the breakdown flows from the collector terminal C11 to C1n to the power supply voltage (e.g. ground (GND) voltage) via the base terminals B11 to B1n and the resistor R2. Then, the voltages of the base regions B21 to B2n increase as the result of voltage drops due to the resistor R2 and the resistances Rb1 to Rbn. The base voltage increase is followed by turning on a diode formed between the N+ emitter diffusion layer 4 and the P− base region 204. As a result, a current flow through a path between the power supply voltage (e.g. ground (GND) voltage) and the pad via the emitter terminals E11 to E1n, the collector terminals C11 to C1n and the current control resistors 11 (R11 to R1n), and thus the surge current due to ESD starts flowing. It is therefore possible to prevent the surge current due to ESD from flowing into the internal circuit.

When an ESD surge current flows from the collector terminals C11 to C1n to the emitter terminal E1i in the bipolar transistor, heat is generated by an electric field which is present in a depletion layer generated in a junction breakdown region (i.e. in the vicinity of a boundary between the P$^-$ base region 204 and the N$^-$ collector region 203 on the collector side) and a current due to electrons flowing into the depletion layer from the emitter terminal E11, resulting in a temperature rise in a current path, particularly, in a region of the depletion layer in which the electric field is strong. Meanwhile, since the plurality of contacts 5 and 8 are arranged in the base width W direction (or in the Y-axis direction) in the same manner as the conventional example, there are the plurality of current paths between the collector and the emitter. In general, a current amount is not guaranteed as being uniform in the plurality of current paths but varies in the base width W direction (or in the Y-axis direction).

According to the present invention, a current path from the contacts 5 of the emitter terminals E11 to E1n to the power supply voltage (e.g. ground (GND) voltage) is separated by the plurality of metal wirings 6, and the current control resistors 11 are present on the respective current paths. It is therefore possible to prevent a local increase (or concentration) of a current flowing from the emitter to the collector terminals C11 to C1n.

According to the present invention, the current between the emitter terminals E11 to E1n and the collector terminals C11 to C1n is suppressed through voltage drops by the current control resistors 11 (R11 to R1n), whereby a current amount between the collector and the emitter where a current is concentrated is also suppressed. For example, if a surge current is concentrated from the collector terminals C11 to C1n to the emitter terminal E1i, a current amount is locally increased between the emitter terminal E1i and the collector terminals C11 to C1n but is suppressed through the voltage drops by the current control resistor R1i. Accordingly, a current which flows from the collector terminals C11 to C1n and assumed to be concentrated on a path passing through the emitter terminal E1i in a case of no current control resistor R1i, starts flowing into the collector terminals C1i to C1n via the emitter terminals other than the emitter terminal E1i. As a result, the amount of a current flowing between the collector terminal C11 to C1n and the emitters E11 to E1n is made uniform.

As described above, in the present invention, current paths are separately provided between the plurality of emitter terminals E11 to E1n and the power supply voltage (e.g. ground (GND) voltage), and the current control resistors R11 to R1n are arranged on the respective current paths. It is therefore possible to suppress current concentration due to deviation in the current density in the base width W direction (or in the Y-axis direction) and enhance ESD endurance which was lowered in the conventional example.

[Second Embodiment]

The base terminals in the ESD protection element in the first embodiment are grounded via the resistor R2 which is arranged externally, whereas base terminals in the ESD protection element according to a second embodiment of the present invention are grounded via the current control resistors R11 to R1n. A configuration and operation of the ESD protection element in the second embodiment will be described below based on difference from the first embodiment.

Figure 7:
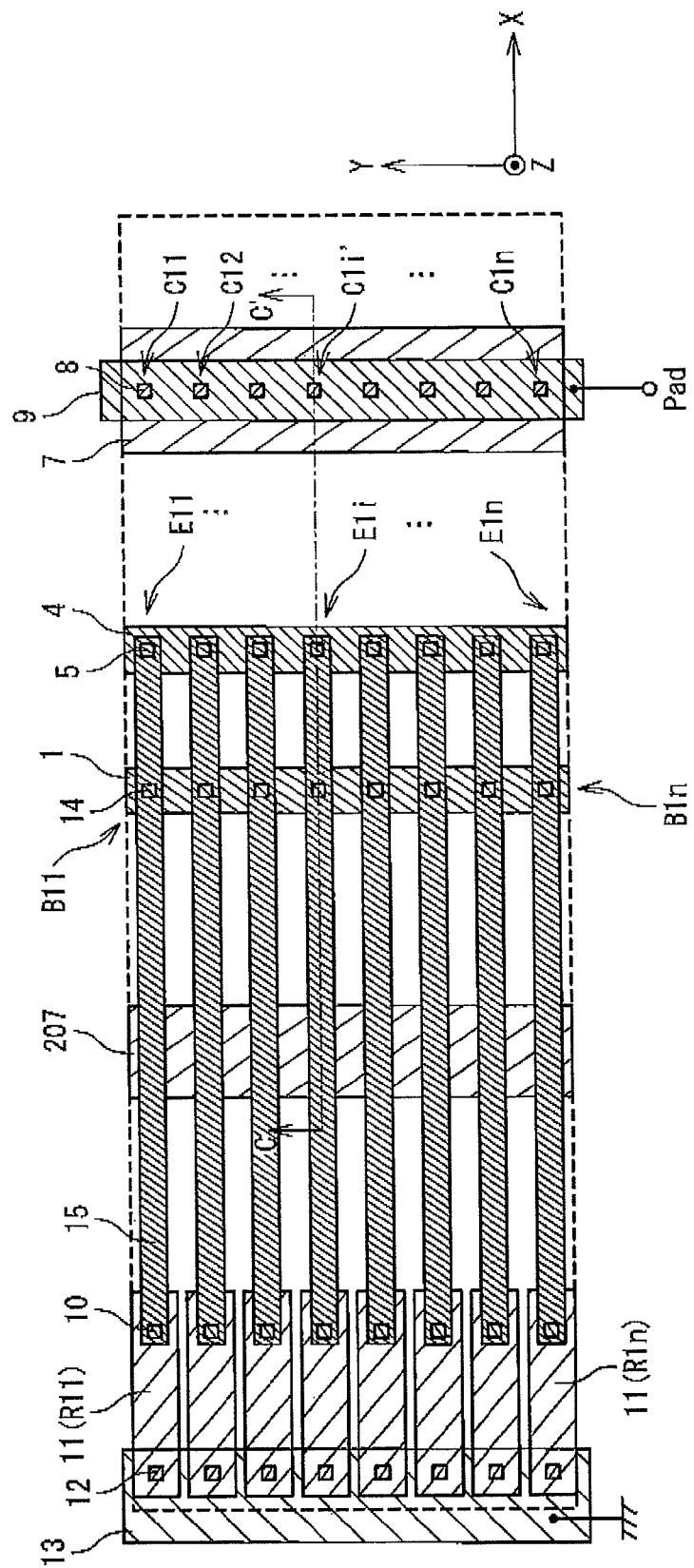
FIG. 7 is a plan view showing a structure of the ESD protection element according to a second embodiment of the present invention.
Figure 8:
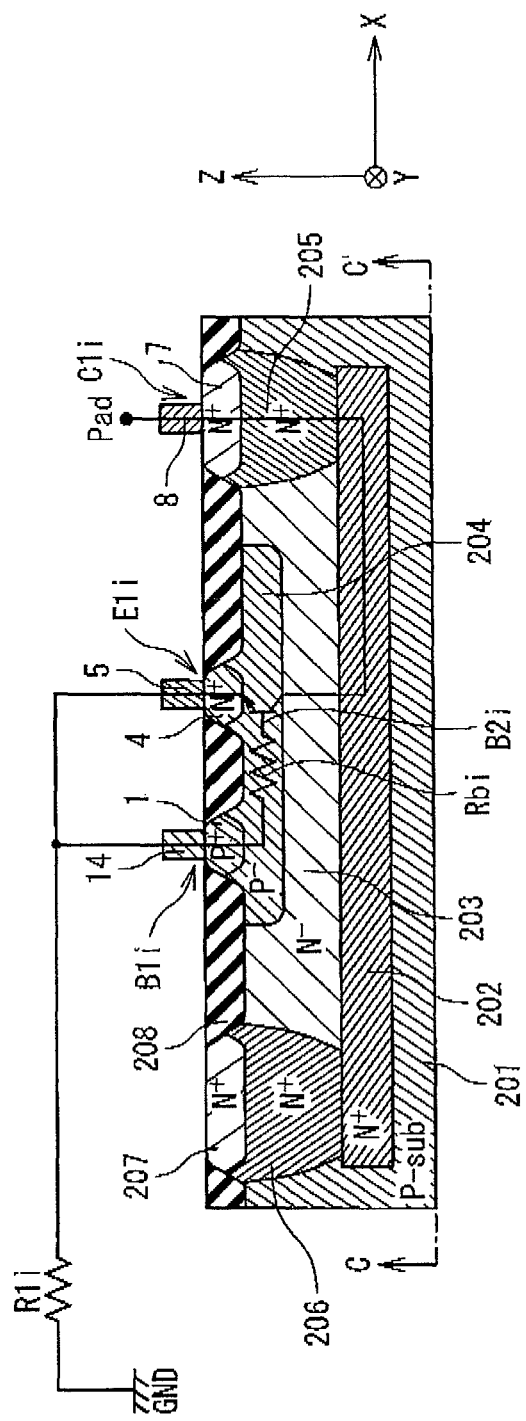
FIG. 8 is a cross sectional view showing the structure of the ESD protection element according to the second embodiment of the present invention along C-C' shown in FIG. 7.
Figure 9:
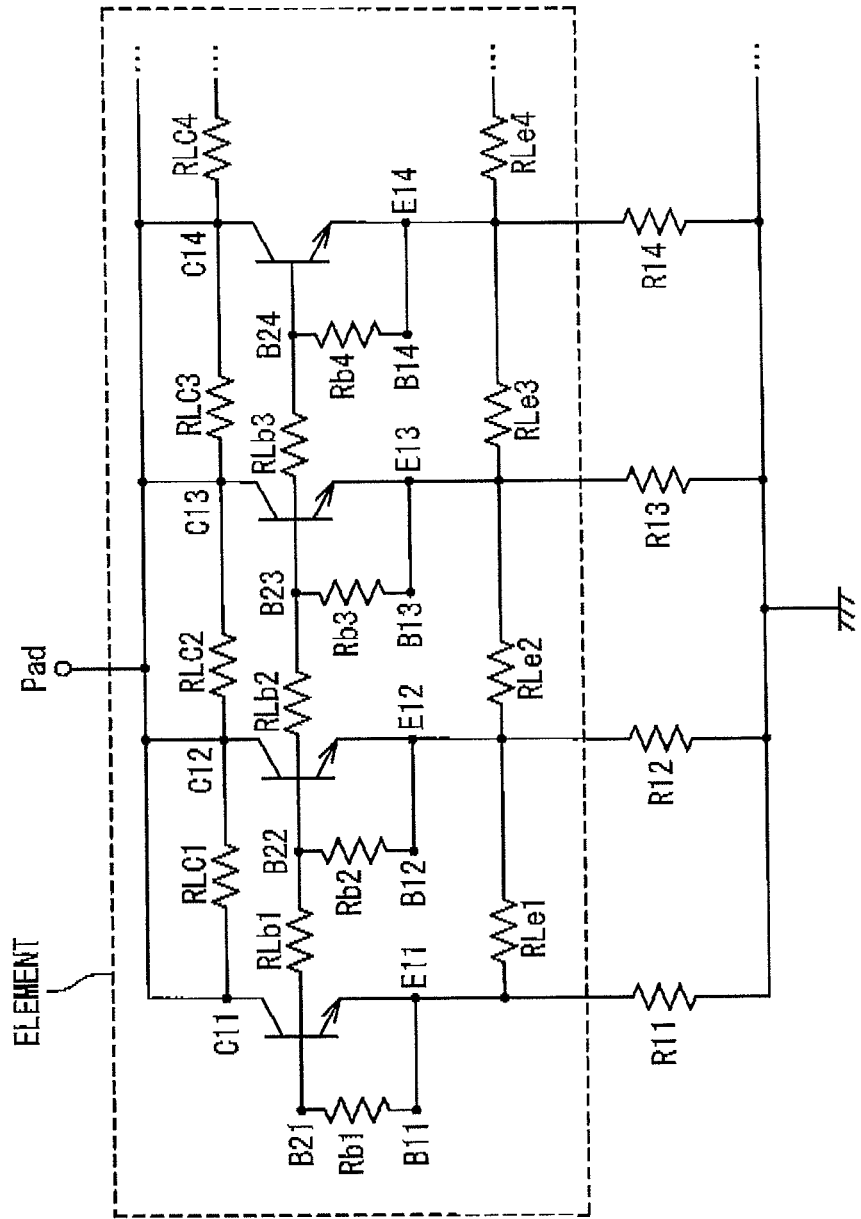
FIG. 9 shows an equivalent circuit of the ESD protection element according to the second embodiment of the present invention.

FIG. 7 is a plan view showing a structure of the ESD protection element in the second embodiment. FIG. 8 is a cross sectional view showing a structure of the ESD protection element in the second embodiment along C-C' shown in FIG. 7. FIG. 9 shows an equivalent circuit of the ESD protection element in the second embodiment. It should be noted that structures of the wiring layers are omitted in FIG. 8.

Referring to FIG. 7, the P$^+$ base diffusion layer 1 is connected to a plurality of metal wirings 15 via a plurality of contacts 14 arranged in the base width W direction (or in the Y-axis direction). The plurality of metal wirings 15 are connected to one ends of the plurality of current control resistors 11 (R11 to R1n) via the plurality of contacts 10. The other ends of the plurality of current control resistors 11 (R11 to R1n) are connected to the common metal wiring 13 via the plurality of contacts 12. The metal wiring 13 is connected to the power supply voltage (e.g. ground (GND) voltage). Therefore, the plurality of contacts 14 function as the base terminals B11 to B1n which are grounded via the respective current control resistors 11 (R11 to R1n).

The N$^+$ emitter diffusion layer 4 is connected to the plurality of metal wirings 15 via the plurality of contacts 5 arranged in the base width W direction (or in the Y-axis direction). Therefore, the plurality of contacts 5 function as the emitter terminals E11 to E1n which are grounded via the respective current control resistors 11 (R11 to R1n).

Each of the P$^+$ base diffusion layer 1 and the N$^+$ emitter diffusion layer 4 in the second embodiment is formed to extend in the base width W direction (or in the Y-axis direction) in the same manner as in the first embodiment.

FIG. 8 shows a cross sectional structure of the ESD element along C-C' shown in FIG. 7. Referring to FIG. 8, in the ESD protection element in the second embodiment, the contacts 14 which function as the base terminals B11 to B1n and the contacts 5 which function as the emitter terminal E11 to E1n are formed on the P$^-$ base region 204 via the P$^+$ base diffusion layer 1 and the N$^+$ emitter diffusion layer 4, respectively. The base terminals B11 to B1n and the emitter terminals E11 and E1n are connected to the power supply voltage (e.g. ground (GND) voltage) in common via the metal wirings 15 and the current control resistors 11 (R11 to R1n). Other structures are similar to those of the first embodiment.

As described above, the ESD protection element in the second embodiment does not use the resistor R2 shown in the first embodiment as a resistor for increasing a base voltage. In the second embodiment, a resistance element (i.e. resistor R2) for allowing a bipolar operation is not required, whereby a chip area can be made smaller. The wirings to connect the emitter terminals E11 to E1n and the current control resistors R11 to R1n are used as wirings to ground the base, which means a chip area can be made further smaller.

By the above configuration, the ESD protection element in the present embodiment can be shown by an equivalent circuit shown in FIG. 9. Referring to FIG. 9, according to the second embodiment, the base terminals B11 to B1n and the emitter terminals E11 to in are connected to the power supply voltage (e.g. ground (GND) voltage) in common via the respective current control resistors R11 to R1n. For example, the base terminal B11 and the emitter terminal E11 are grounded via the current control resistor R11. Other circuit configurations are similar to those of the first embodiment so that description thereof will be omitted.

Next, an operation of the ESD protection element in the second embodiment will be described.

When a high voltage pulse due to ESD is applied to the pad, the voltages of the N$^+$ collector diffusion layer 7 and the N lead-out region 205 increase rapidly. At this time, breakdown occurs in a junction between the P⁻ base region 204 and the N⁻ collector region 203, and a hole current generated through the breakdown flows into the P⁻ base region 204 and then to the power supply voltage (e.g. ground (GND) voltage) via the base terminals B11 to B1n and the current control resistors 11 (R1i to R1n). Then, voltages (i.e. base voltages) of the base terminals B2i to B2n increase due to the voltage drops by the resistances Rb1 to Rbn. A diode formed between the N⁺ emitter diffusion layer 4 and the P⁻ base region 204 is turned on subsequently to the base voltage increase, and a surge current due to ESD starts flowing between the power supply voltage (e.g. ground (GND) voltage) and the pad via the emitter terminals E11 to E1n, the collector terminals C11 to C1n and the current control resistors 11 (R11 to R1n). It is therefore possible to prevent the surge current due to ESD from flowing into the internal circuit (not shown).

Since the plurality of base terminals B11 to B1n and the plurality of collector terminals C11 to C1n are arranged in the base width W direction (or in the Y-axis direction), there are a plurality of current path regions between the collector and the base. Meanwhile, there is a case of a local breakdown occurring due to process variations and three-dimensional layout effects. In such a case, a junction breakdown due to ESD occurs locally or widely. When the amount of a current generated through local breakdown is compared to that generated through wide breakdown, the amount of a current generated through the wide breakdown is larger than that generated through the local breakdown. Accordingly, if the resistor R2 is commonly provided between the base terminals B11 to B1n and the power supply voltage (e.g. ground (GND) voltage) in addition to the resistances Rb1 to Rbn as shown in the first embodiment, the amount of a current flowing into the resistor R2 deviates depending on a region where breakdown occurs, and as a result, an increase amount of a base voltage deviates depending on how the breakdown occurs. In this case, a small region in which breakdown occurs is accompanied by a small increase amount of a base voltage, which means that it is impossible for the ESD protection element to perform a bipolar operation without increasing the resistor R2.

In the second embodiment, even if a breakdown occurs locally, a base current due to the breakdown flow through the base resistances Rb1 to Rbn in the vicinity of the region in which breakdown occurs and the current control resistors 11 to 1n connected to the base resistances via the metal wirings 15. Therefore, when a current density of the base current is same, the base voltages increase in the same manner with no relation to a breakdown generation area. Accordingly, in the ESD protection element of the second embodiment, a stable bipolar operation is performed regardless of the size and position of the region where breakdown occurs, and therefore it is unnecessary to increase the values of the current control resistors 11 used for increase of the base voltage.

When the resistance values (between the base region B21 to B2n and power supply voltage (e.g. ground (GND) voltage)) are increased to raise the base voltages for a bipolar operation, the noise endurance sometimes reduces to the base. Here, referring to FIG. 5, a mechanism that a malfunction occurs due to noise will be described. There is a junction capacitance (Ccb) between the collector (203) and the base (P⁻ base region 204). Therefore, when noise is inputted the collector, a current due to the noise flows into the junction capacitance (Ccb) and then flows to the power supply voltage (e.g. ground (GND) voltage) through the base. At this time, the current due to the noise flows through the base resistances Rb1 to Rbn and the resistance R2 so that voltage drops generate to change the voltages of the base regions B21 to B2n (the base voltages). Therefore, the change in the voltage of the base region B2i is (noise current)×(R2+Rbi), and this change becomes larger as the resistance R2 is made larger. At this time, a continuation time of the change in the voltage of the base region B2i (the base voltage) is determined based on (R2+Rbi)×Ccb. In this case, when a time period during which the base voltage is higher than the emitter voltage is longer than a time necessary for a bipolar transistor to start the operation, the bipolar transistor is turned on and becomes a conductive state. In order to avoid such a bipolar operation due to the noise, the value of the resistance R2 needs to be made small so that a delay of a voltage propagation time must be made smaller than the necessary time for the bipolar operation and a predetermined time which is determined based on a noise frequency.

In the second embodiment, it is not required to arrange the resistance R2 between the base and power supply voltage (e.g. ground (GND) voltage), which is provided in the ESD protection element in the first embodiment. Therefore, it is possible to avoid the bipolar operation due to the noise. That is, according to the ESD protection element in the second embodiment, not only ESD endurance but also noise endurance can be improved.

[Third Embodiment]

Figure 10:
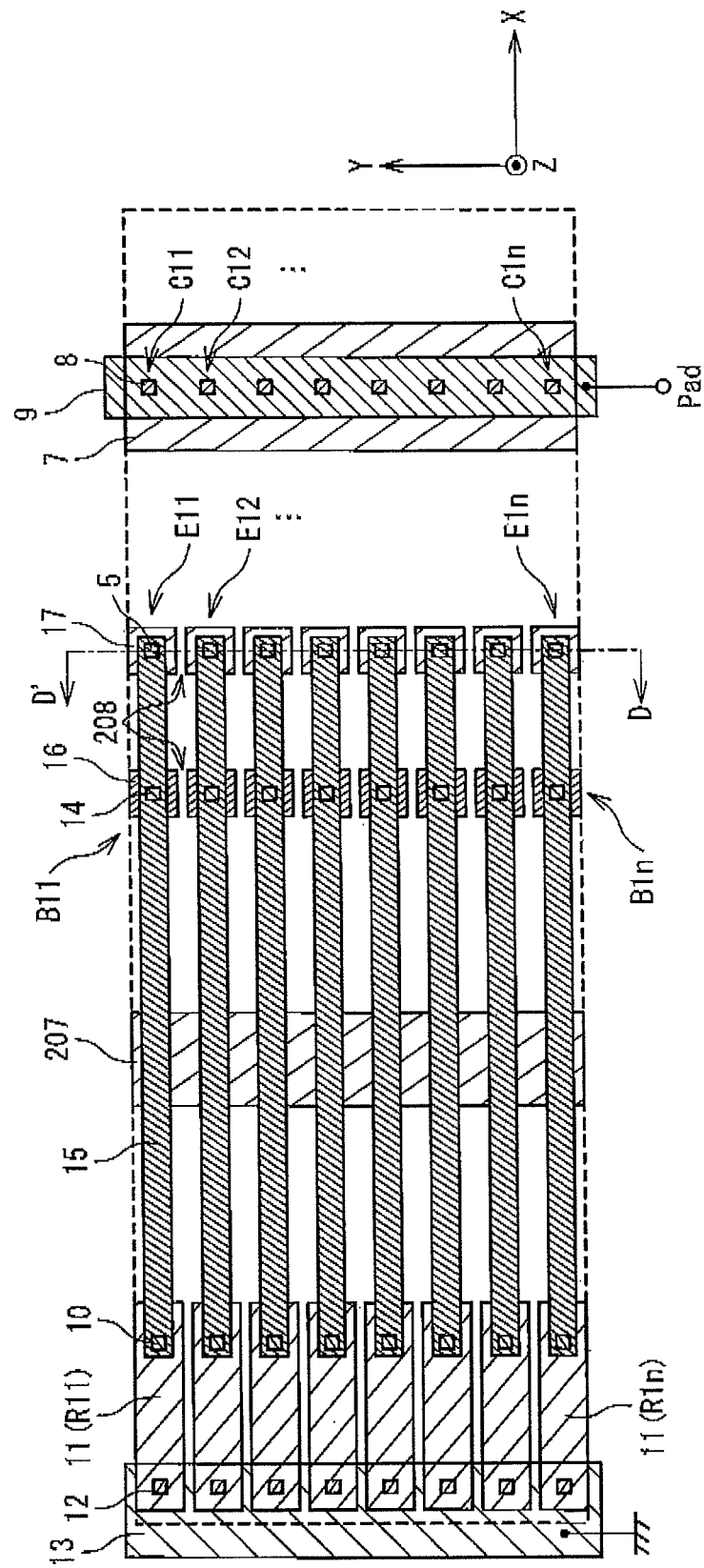
FIG. 10 is a plan view showing the structure of the ESD protection element according to a third embodiment of the present invention.
Figure 11:
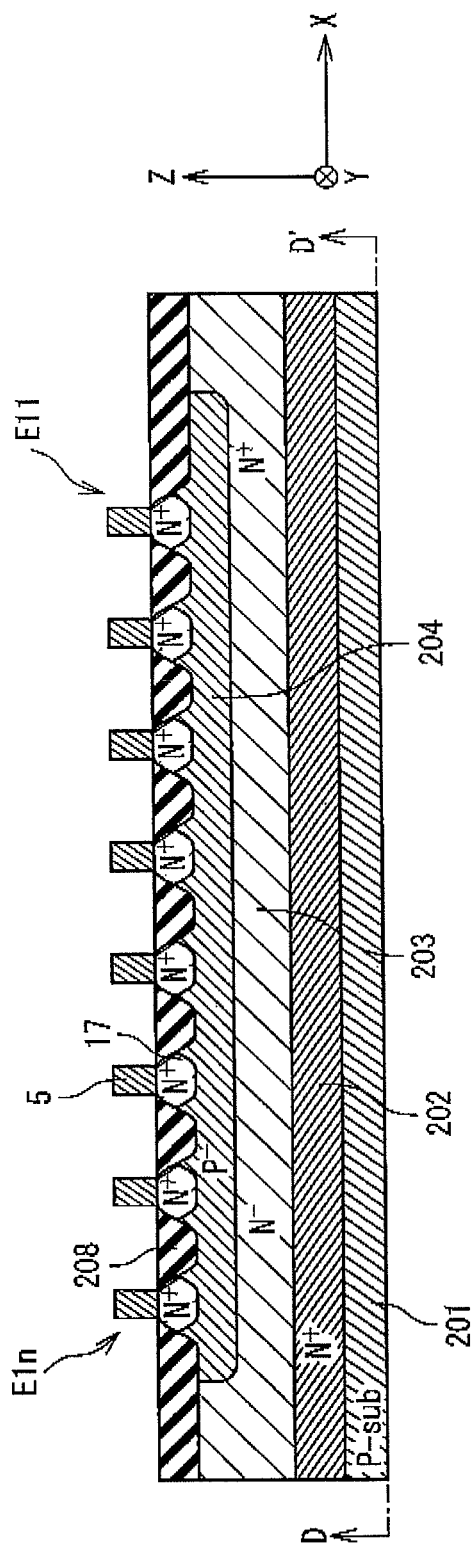
FIG. 11 is a cross sectional view showing the structure of the ESD protection element according to the third embodiment of the present invention along D-D' shown in FIG. 10.
Figure 12:
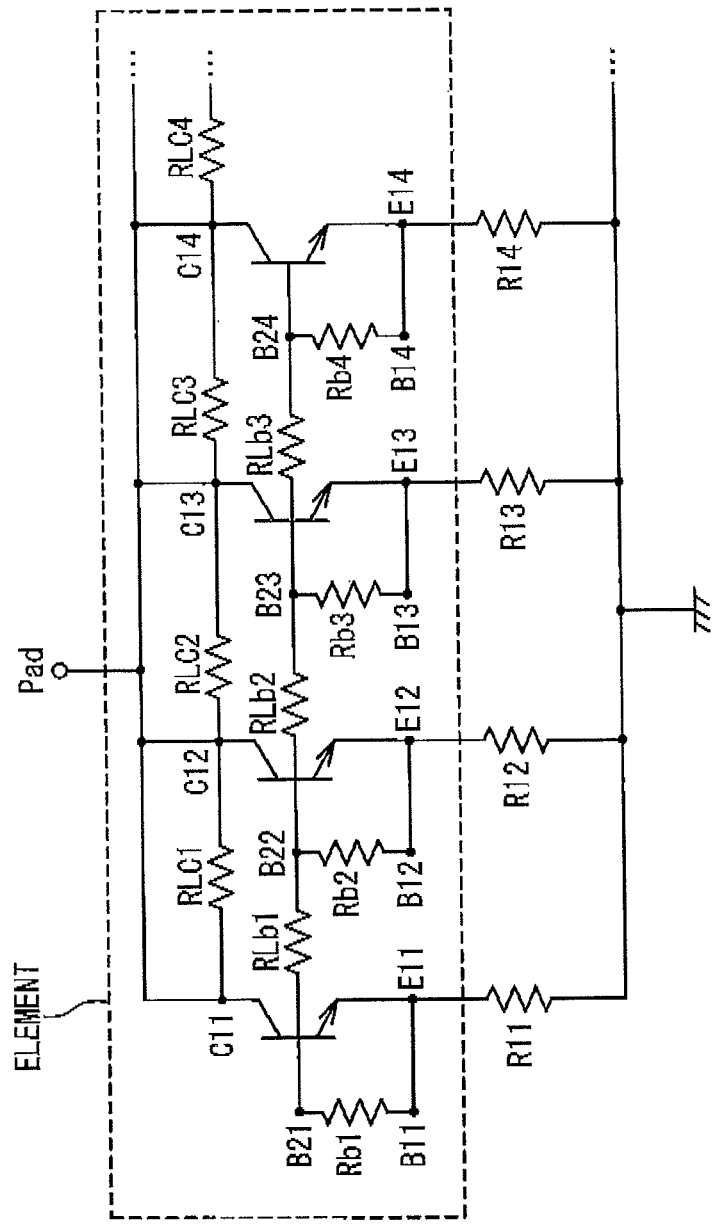
FIG. 12 shows an equivalent circuit of the ESD protection element according to the third embodiment of the present invention.

FIG. 10 is a plan view showing, a structure of the ESD protection element according to a third embodiment of the present invention. FIG. 11 is a cross sectional view showing a structure of the ESD protection element according to the third embodiment of the present invention along D-D' shown in FIG. 10. It should be noted that structures of the wiring layers are omitted in FIG. 11. FIG. 12 shows an equivalent circuit of the ESD protection element according to the third embodiment. Referring to FIGS. 10 to 12, the ESD protection element according to the third embodiment of the present invention will be described.

In the ESD protection elements in the first and second embodiments, each of the P⁺ base diffusion layer 1 and the N⁺ emitter diffusion layer 4 is formed to extend in the base width W direction (or in the Y-axis direction). In contrast, referring to FIGS. 10 to 11, in the ESD protection element according to the third embodiment, a plurality of P⁺ base diffusion layers 16 are separated for the contacts 14 and a plurality of separated N⁺ emitter diffusion layers 17 are separated for the contacts 5 in the base width W direction (or in the Y-axis direction). A configuration and operation of the ESD protection element in the third embodiment will be described below based on differences from those of the second embodiment.

Referring to FIG. 10, the P⁺ base diffusion layers 16 and the N⁺ emitter diffusion layers 17 are formed in the base width W direction (or in the Y-axis direction) in the ESD protection element in the third embodiment, so as to be separated from each other by the element separation region 208. More specifically, referring to FIG. 11, the plurality of N⁺ emitter diffusion layers 17 are separated from each other by the element separation region 208 and formed on the P⁻ base region 204 corresponding to the plurality of contacts 5. Similarly, the plurality of P⁺ base diffusion layers 16 are separated from each other by the element separation region 208 and formed on the P⁻ base region 204 corresponding to the plurality of contacts 14. Other structures are similar to those of the second embodiment.

In the ESD protection element of the present embodiment, the plurality of P⁺ base diffusion layers 16 and the plurality of N⁺ emitter diffusion layers 17 are formed for the plurality of contacts 5 and 14 and the metal wirings 15 (current paths for the surge current). The plurality of P⁺ base diffusion layers 16 and the N⁺ emitter diffusion layers 17 are separated from each other in the base width W direction (or in the Y-axis direction), so that the surge current flows through the separated $N^+$ emitter diffusion layers 17 and $P^+$ base diffusion layers 16 and is not concentrated in one path. In the case of the $P^+$ base diffusion layer and the $N^+$ emitter diffusion layer which are not separated from each other in the base width W direction (or in the Y-axis direction) as shown in the second embodiment, the current is concentrated in a specific path by flowing through the $N^+$ emitter diffusion layers 17 and the $P^+$ base diffusion layers 16, resulting in element destruction. However, in the present embodiment, current paths are separated by the element separation region 208, whereby a local deviation in the temperature rise and other factors to promote current concentration are suppressed so that the current concentration in a specific path can be prevented.

Through to the above structure, the ESD protection element according to the present embodiment can be shown by an equivalent circuit shown in FIG. 12. Referring to FIG. 12, in the third embodiment, the resistances RLe1 to RLe(n−1) between the emitter terminals E11 to E1n are removed from the ESD protection circuit shown in FIG. 9. Other circuit structures are similar to those of the second embodiment so that the description thereof will be omitted.

Since the emitter terminals E11 to E1n are separated from each other, current paths between the emitter terminals are blocked off. The current control resistors R11 to R1n are connected to the emitter terminals E11 to E1n, respectively. Therefore, a current flowing out to the power supply voltage (e.g. ground (CND) voltage) is distributed to flow through the current control resistors R11 to R1n, and thus concentration of the surge current can be avoided. As described above, in the third embodiment, current concentration in a breakdown path is reduced in comparison with the second embodiment and ESD endurance can be further improved.

Figure 13:
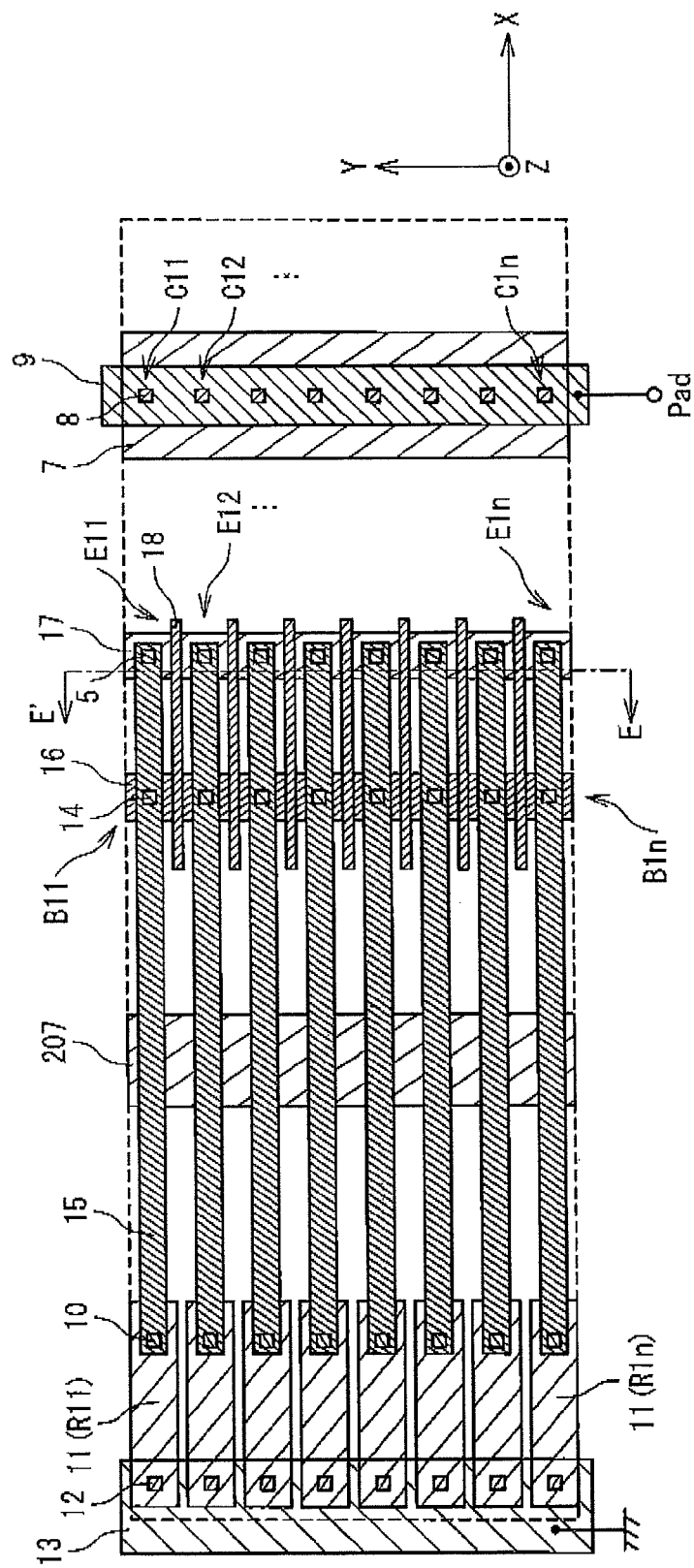
FIG. 13 is a plan view showing a modified example of the structure of the ESD protection element according to the third embodiment of the present invention.
Figure 14:
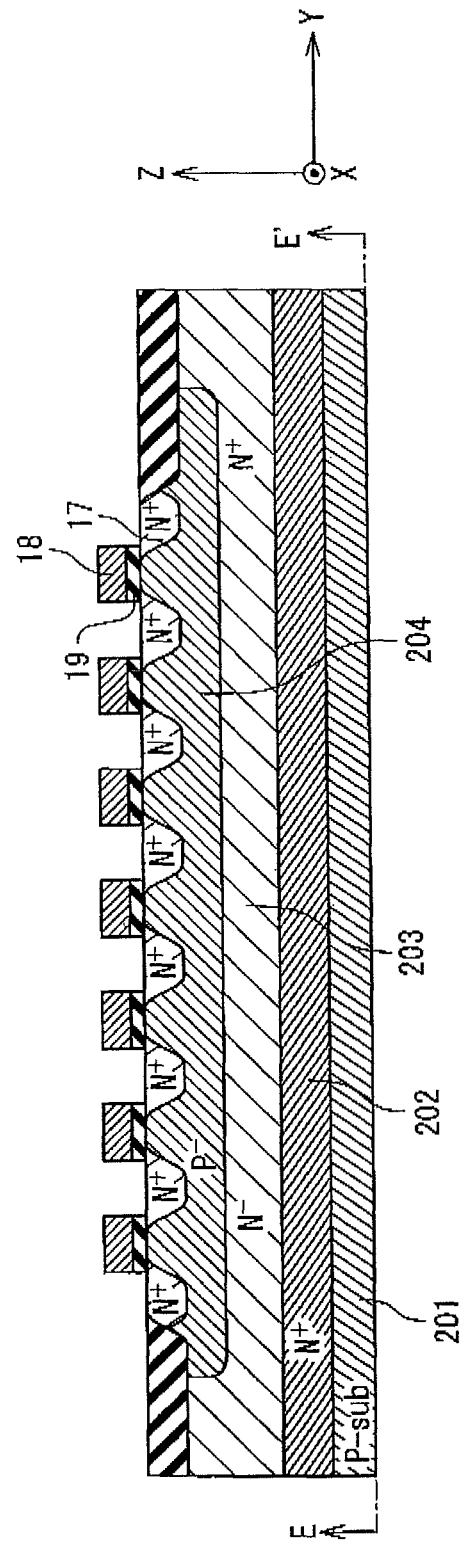
FIG. 14 is a cross sectional view showing the structure of the modified example of the ESD protection element according to the third embodiment of the present invention along E-E' shown in FIG. 13.

Although the ESD protection element shown in FIGS. 10 and 11 includes the plurality of $P^+$ base diffusion layers 16 and the plurality of $N^+$ emitter diffusion layers 17 which are separated from each other by the element separation region, they may be separated by polysilicon gates 18 as shown in FIGS. 13 and 14. Referring to FIGS. 13 and 14, the configuration of a modification example of the ESD protection element according to the third embodiment of the present invention will be described. FIG. 13 is a plan view showing a modification example of the structure of the ESD protection element according to the third embodiment of the present invention. FIG. 14 is a cross sectional view showing a structure of the modification example of the ESD protection element according to the third embodiment of the present invention along E-E' shown in FIG. 13. It should be noted that structures of the wiring layers are omitted in FIG. 14.

Referring to FIGS. 13 and 14, the plurality of $N^+$ emitter diffusion layers 17 are separated from each other by the polysilicon gates 18 and provided on the $P^-$ base region 204 for the plurality of contacts 5. Similarly, the plurality of $P^+$ base diffusion layers 16 are separated from each other by polysilicon gates 18 and provided on the $P^-$ base region 204 for the plurality of contacts 14. The polysilicon gates 18 are formed on gate insulating films 19 which are formed on the $P^-$ base region 204 between the $N^+$ emitter diffusion layers 17 and the $P^+$ diffusion layers 16.

In the present modification example, current paths are separately provided by the polysilicon gates 18, whereby the amount of the surge current flowing into a current path adjacent to a breakdown portion from other regions is made smaller for eliminated). Therefore, current concentration in the breakdown portion is reduced in comparison with the second embodiment and the ESD endurance is further improved.

Although the ESD protection element according to the third embodiment avoids concentration of the surge current by using the current control resistors R11 to R1n which are arranged in the outside, of regions in which the bipolar transistor is formed, the current control resistors R11 to R1n may be arranged in the regions in which the bipolar transistors are formed. For example, by extending the width of the emitter diffusion layers in a direction along a current path from the emitter and the power supply voltage (e.g. ground (GND) voltage), a resistance component of the emitter diffusion layer or a silicide film formed on the emitter diffusion layer can be used as the current control resistors R11. Below, the ESD protection element in fourth to seventh embodiments in which the current control resistors are provided in regions in which the bipolar transistors are formed will be described.

[Fourth Embodiment]

Figure 15:
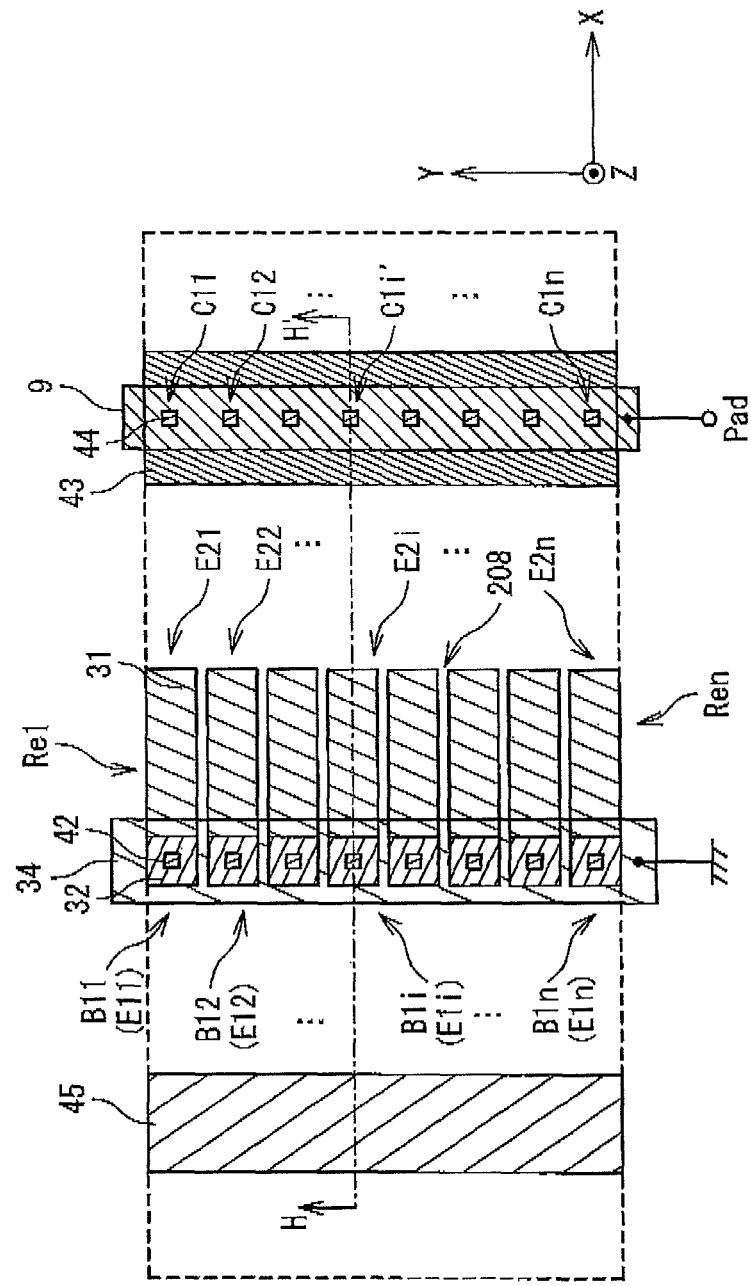
FIG. 15 is a plan view showing the structure of the ESD protection element according to a fourth embodiment of the present invention.
Figure 16:
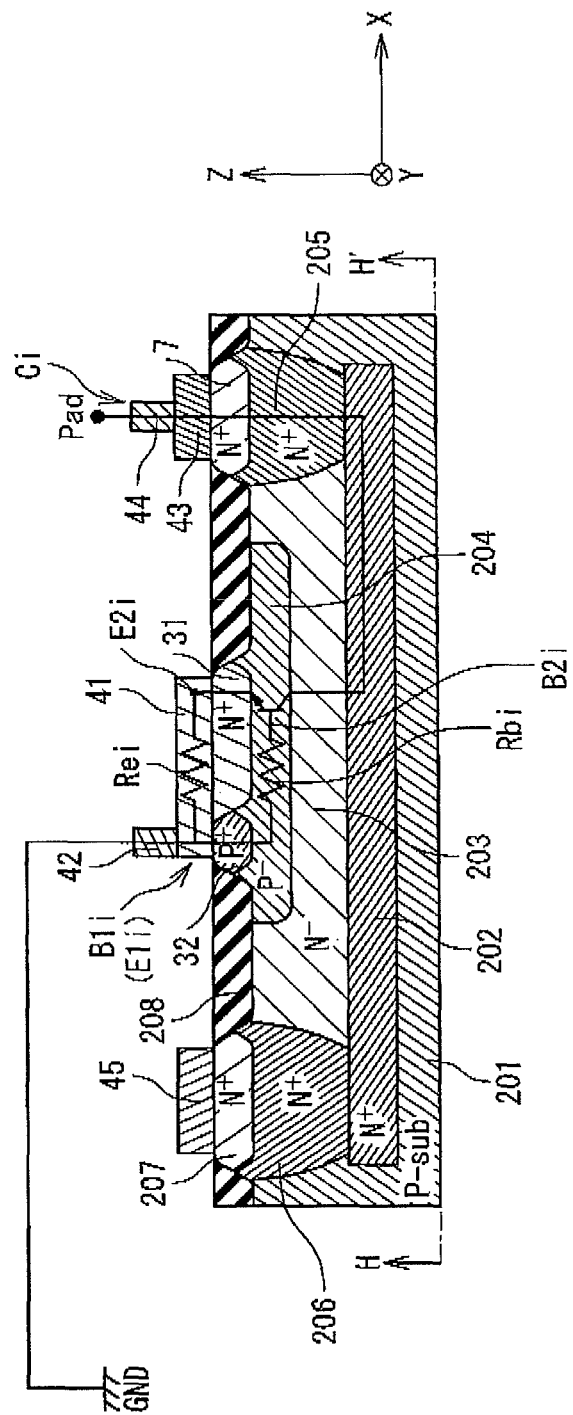
FIG. 16 is a cross sectional view showing the structure of the ESD protection element according to the fourth embodiment of the present invention along H-H' shown in FIG. 15.
Figure 17:
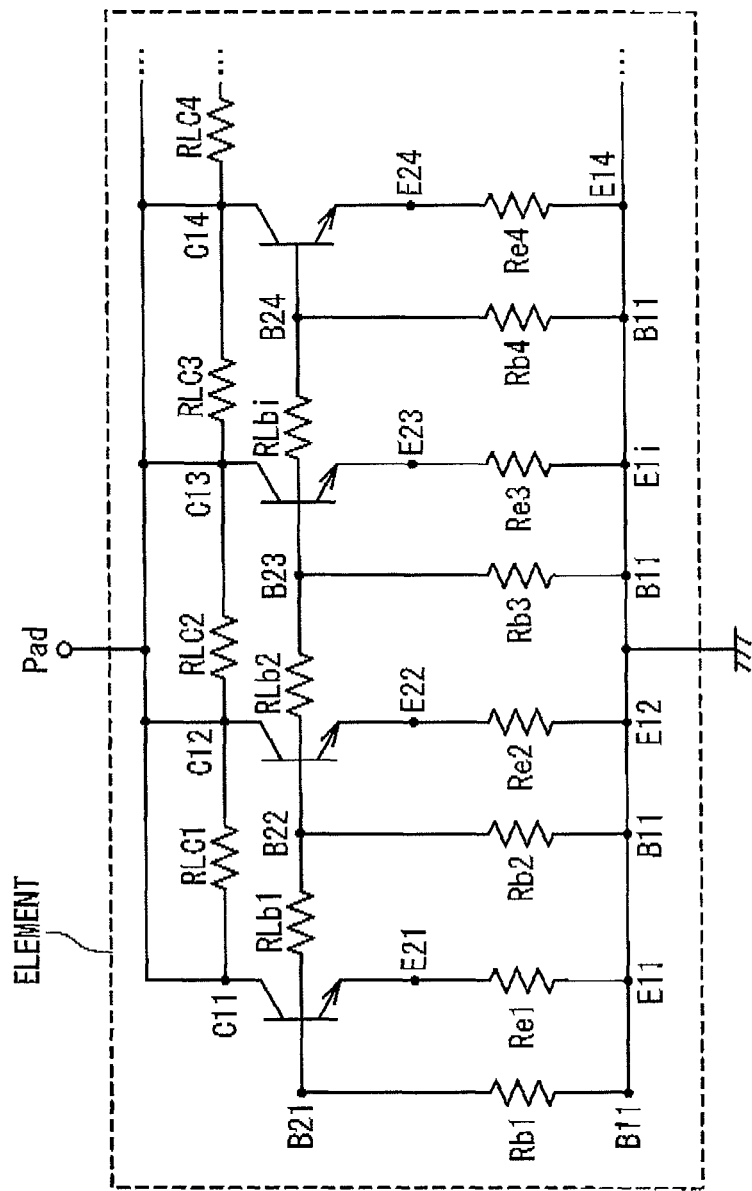
FIG. 17 shows an equivalent circuit of the ESD protection elements according to the fourth to seventh embodiments of the present invention.

FIG. 15 is a plan view showing a structure of the ESD protection element according to the fourth embodiment of the present invention. FIG. 16 is a cross sectional view showing a structure of the ESD protection element according to the fourth embodiment of the present invention along H-H' shown in FIG. 15. FIG. 17 shows an equivalent circuit of the ESD protection element according to the fourth embodiment of the present invention. It should be noted that a silicide film 41 is omitted in FIG. 15 and the structure of the wiring layers is omitted in FIG. 16. In the other embodiments of the present invention, both cases with silicide and without silicide are applicable but explanation regarding silicide will be omitted. With reference to FIGS. 15 to 17, the structure and operation of the ESD protection element according to the fourth embodiment of the present invention will be described based on the difference from the third embodiment.

Referring to FIGS. 15 and 16, a plurality of $N^+$ emitter diffusion layers 31 and a plurality of $P^+$ base diffusion layers 32 are formed in the ESD protection element in the fourth embodiment to separated from each other by the element separation region 208 in the base width W direction (or in the Y-axis direction). The plurality of $N^+$ emitter diffusion layers 31 and the plurality of $P^+$ base diffusion layers 32 are aligned adjacent to each other in a direction perpendicular to the base width direction (i.e. in an X-axis direction). In the fourth embodiment, silicide films are formed on the emitter diffusion layers and resistance components of the silicide film (i.e. resistances Re1 to Ren) are used as the current control resistors for suppressing current concentration of the surge current. More specifically, the silicide films 41 are formed on the $N^+$ emitter diffusion layers 31 and the $P^+$ base diffusion layers 32. Contacts 42 are formed on a portion of the silicide film 41 on the $P^+$ base diffusion layers 32, and the $P^+$ base diffusion layers 32 are connected to a metal wiring 34 via the contacts 42. The metal wirings 34 are connected to the power supply voltage (e.g. ground (GND) voltage). The silicide films 43 and 45 are formed on the $N^+$ collector diffusion layer 7 and the $N^+$ diffusion layer 207, respectively. A plurality of contacts 44 are formed on the silicide films 43 on the $N^+$ collector diffusion layers 7, and the $N^+$ collector diffusion layers 7 are connected to a metal wiring 9 (i.e. pad) via the contacts 44.

Referring to FIG. 16, the $N^+$ emitter diffusion layers 31 and the $P^+$ base diffusion layers 32 are formed on the $P^-$ base region 204 which serves as a base region. The $N^+$ emitter diffusion layers 31 are formed between the $P^+$ base diffusion layers 32 and the $N^+$ collector diffusion layer 7, and a width thereof in the direction perpendicular to the base width direction (i.e. in the Y-axis direction) is set to a predetermined length. Therefore, end portions (i.e. emitter terminal E1i) of the N⁺ emitter diffusion layers 31 on the side of the P⁺ base diffusion layers 32 (i.e. base terminals B11 to B1n) and end portions (i.e. emitter regions E2i) thereof on the side of the N⁺ collector diffusion layer 7 (i.e. collector terminals C11 to C1n) are distanced by a predetermined distance.

Referring to FIG. 16, when a high voltage is applied to the pad so that the ESD protection element is subjected to a bipolar operation, if the surge current flowing between the power supply voltage (e.g. ground (GND) voltage) and the collector terminals C11 to C1n is assumed to be due to a flow of electrons, the electrons flow from the contacts 42 (i.e. emitter region portions E11 to E1n) to the collector side (i.e. N⁺ lead-out region 205) via the silicide films 41. At this time, the flow of electrons due to the surge current is formed from the contacts 42 (i.e. emitter region portions E11 to E1n) to the silicide films 41, and then from the end portions (i.e. emitter region portions E21 to E2n) of the N⁺ emitter diffusion layers 31 to the collector side (N⁺ lead-out region 205). Therefore, a resistance component (i.e. resistance Rei) of the silicide film 41 from the contact 42 (i.e. emitter region portion E1i) to the vicinity of the emitter region portion E2i on the collector side functions as a current control resistor for controlling a current amount of the surge current. It is therefore possible to prevent the surge current from being concentrated in the emitter terminal E1i.

Moreover, if a breakdown occurs in a high voltage is applied to the pad so that a junction between the P⁻ base region 204 and the N⁻ collector region 203, a hole current flowing into the base region B2i below the emitter region E2i flows out to the power supply voltage (e.g. ground (GND) voltage) via the contact 42. At this time, a resistance component (i.e. resistance Rbi) of the base region (i.e. P⁻ base region 204) from the contact 42 (i.e. base terminal B1i) to the base region B2i below the emitter region E2i functions as a resistor for raising a voltage of the base region B2i (i.e. base voltage).

A width of the N⁺ diffusion layer 31 in a direction from the base to the collector (i.e. length from the emitter region E1i to the emitter region E2i) is preferably set so as to allow the current control resistor (i.e Rei) to prevent current concentration of the surge current. The width of the N⁺ diffusion layer 31 is also preferably set so as to allow the resistance Rbi to raise the base voltage to a voltage in which a bipolar operation can be carried out.

By the above structure, the ESD protection element according to the present embodiment can be shown by an equivalent circuit shown in FIG. 17. Referring to FIG. 17, a plurality of NPN bipolar transistors are formed as the ESD protection element in the fourth embodiment to have the emitter regions E21 to E2n, the base regions B21 to B2n, and the collector terminals C11 to C1n.

Referring to FIGS. 15 and 17, the emitter terminals E11 to E1n are separated from each other by the element separation region 208. Also, the resistances Re1 to Ren of the silicide films 41 are formed between the emitter regions E21 to E2n and the emitter terminals E11 to E1i. Meanwhile, the resistances RLb1 to RLb(n−1) of the P⁻ base region 204 are formed between the base regions B21 to B2n below the emitter terminals E11 to E1n, respectively. The collector terminals C11 to C1n are formed commonly on the N⁻ embedded layer 202 and the N⁺ lead-out region 205. Therefore, the resistances RLC1 to RLCn of the N⁻ embedded layers 202 and the N⁺ lead-out regions 205 are formed between the collector terminals C11 to C1n. Further, the resistances Rb1 to Rbn of the P⁻ base region 204 are formed between the base regions B21 to B2n and the base terminals B11 to B1i.

As described above, the emitters in the plurality of transistors are separated from each other by the element separation region. Therefore, the current paths for the surge current flowing into the plurality of transistors are separated. The emitter terminals E11 to E1n are connected to the respective resistances Re1 to Ren functioning as current control resistors. By the above structure, an electron current (i.e. surge current) flowing from the power supply voltage (e.g. ground (GND) voltage) is distributed and flows on the plurality of resistances Re1 to Ren, whereby current concentration in a specific emitter terminal E1i can be avoided.

The resistances Rb1 to Rbn are formed by the P⁻ base region 204 between the base terminals B11 to B1n and the base regions B21 to 21n. When a high voltage is applied to the pad, voltages are increased in the base regions B21 to B2n by the resistances Rb1 to Rbn and the ESD protection element starts a bipolar operation.

As described above, in the ESD protection element according to the present embodiment, the current control resistors (i.e. resistances Re1 to Ren) for avoiding current concentration of the surge current are formed by the silicide films 41, and the resistances Rb1 to Rbn for raising the base voltages are formed by the P⁻ base region 204. It is therefore unnecessary to provide a resistor for current control and a resistor for raising the base voltage in the outside of the device, whereby a wiring amount and the number of elements can be reduced in the ESD protection element.

[Fifth Embodiment]

Figure 18:
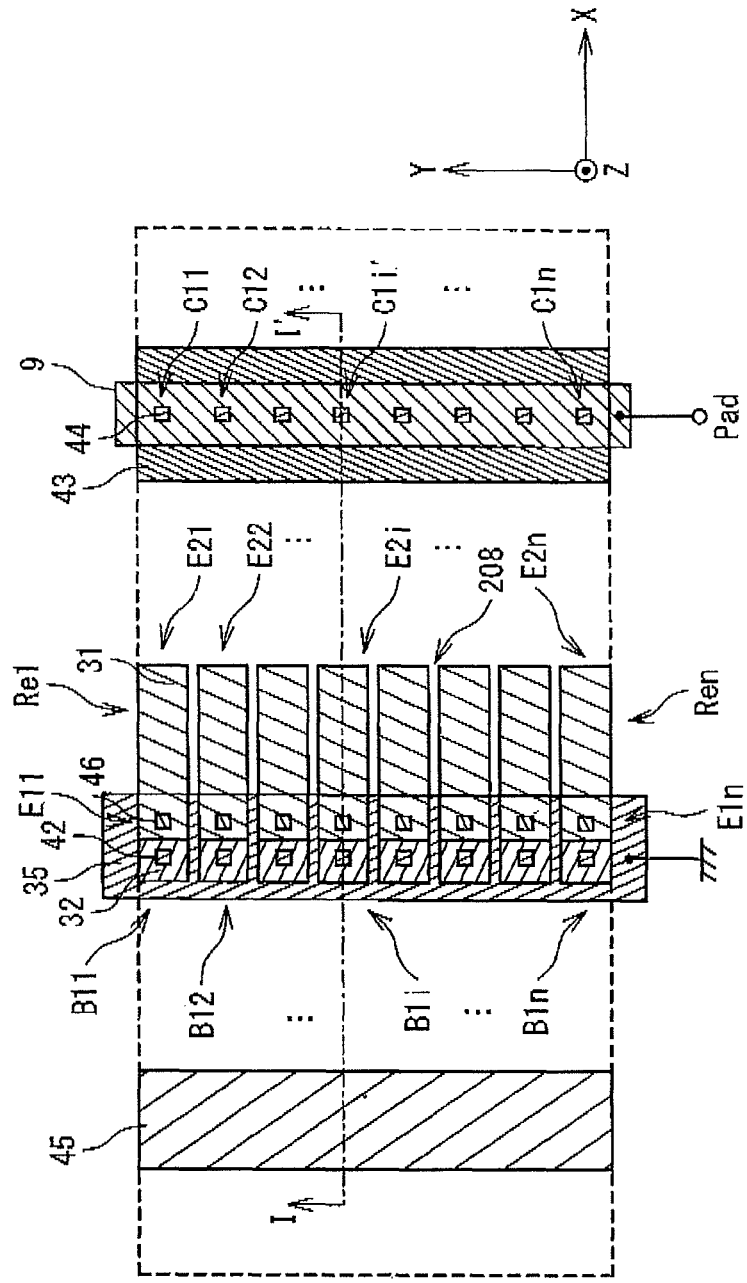
FIG. 18 is a plan view showing the structure of the ESD protection element according to a fifth embodiment of the present invention.
Figure 19:
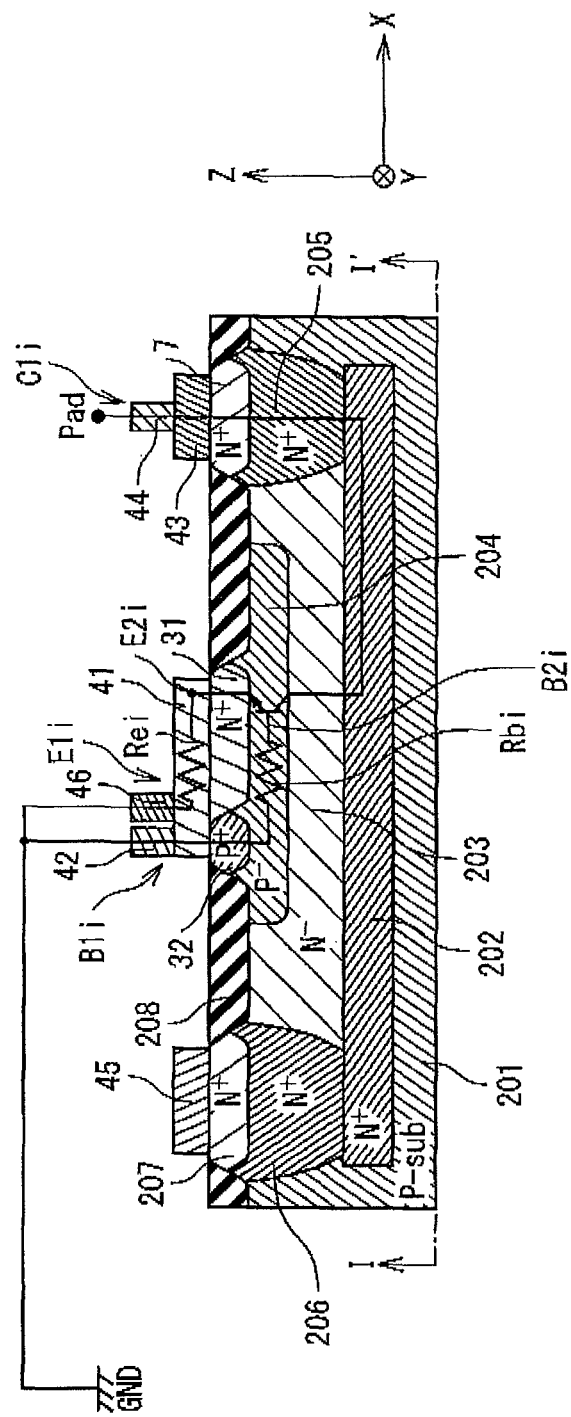
FIG. 19 is a cross sectional view showing the structure of the ESD protection element according to the fifth embodiment of the present invention along I-I' shown in FIG. 18.

FIG. 18 is a plan view showing the structure of the ESD protection element according to a fifth embodiment of the present invention. FIG. 19 is a cross sectional view showing the structure of the ESD protection element according to the fifth embodiment of the present invention along I-I' shown in FIG. 18. Referring to FIGS. 18 and 19, the ESD protection element according to the fifth embodiment of the present invention will be described based on the difference from the fourth embodiment. It should be noted that the silicide films 41 are omitted in FIG. 18 and the structure of the wiring layers is omitted in FIG. 19.

According the fourth embodiment, the surge current (i.e. collector current) flows into the N⁺ emitter diffusion layers 31 via the contacts formed on the P⁻ base diffusion layers 32. In contrast, in the fifth embodiment, the surge current flows via contacts formed on the N⁺ emitter diffusion layers 31. More specifically, contacts 46 are formed on the silicide films 41 above the N⁺ emitter diffusion layers 31. The silicide films 41 are connected to a metal wiring 35 via the contacts 46. It should be noted that the metal wiring 35 is connected to the power supply voltage (e.g. ground (GND) voltage). The contacts 46 are preferably arranged adjacent to the contacts 42 on the P⁻ base diffusion layers 32.

Referring to FIG. 19, when a high voltage is applied to the pad so that the ESD protection element is subjected to a bipolar operation, the current (i.e. surge current) flowing between the power supply voltage (e.g. ground (GND) voltage) and the collector terminals C11 to C1n flows from the contacts 46 to the collector side (i.e. N⁺ lead-out region 205) via the silicide films 41 in a case of a flow of electrons. At this time, the electrons flow from the contacts 46 (i.e. emitter terminals E11 to E1n) to the silicide films 41, and then flow out from end portions (i.e. emitter regions E21 to E2n) of the N⁺ emitter diffusion layers 31 on the collector side (i.e. N⁺ lead-out region 205). Therefore, a resistance component (i.e. resistance Rei) of the silicide film 41 from the contact 46 (i.e. emitter terminal E1i) to the vicinity of the emitter region E2i on the collector side and a resistance component of the contact 46 (which is omitted in FIG. 17) function as a current control resistor for controlling a current amount of a collector current. It is therefore possible to prevent the surge current from being concentrated in the emitter terminal E1i. Other structures and operations are similar to those of the fourth embodiment.

According to the fifth embodiment, the resistance component of the contact 46 can be used for the current control resistor, whereby a width of the $N^+$ emitter diffusion layers 31 (i.e. a length from the emitter terminal E1i to the emitter region E2i) can be made smaller than that of the fourth embodiment. It should be noted that the width of the $N^+$ diffusion layers 31 is set, as needless to say, so as to allow the resistance Rei to raise a base voltage to a voltage by which a bipolar operation can be carried out.

By the above configuration, the ESD protection element according to the present embodiment can be shown by the equivalent circuit shown in FIG. 17.

[Sixth Embodiment]

Figure 20:
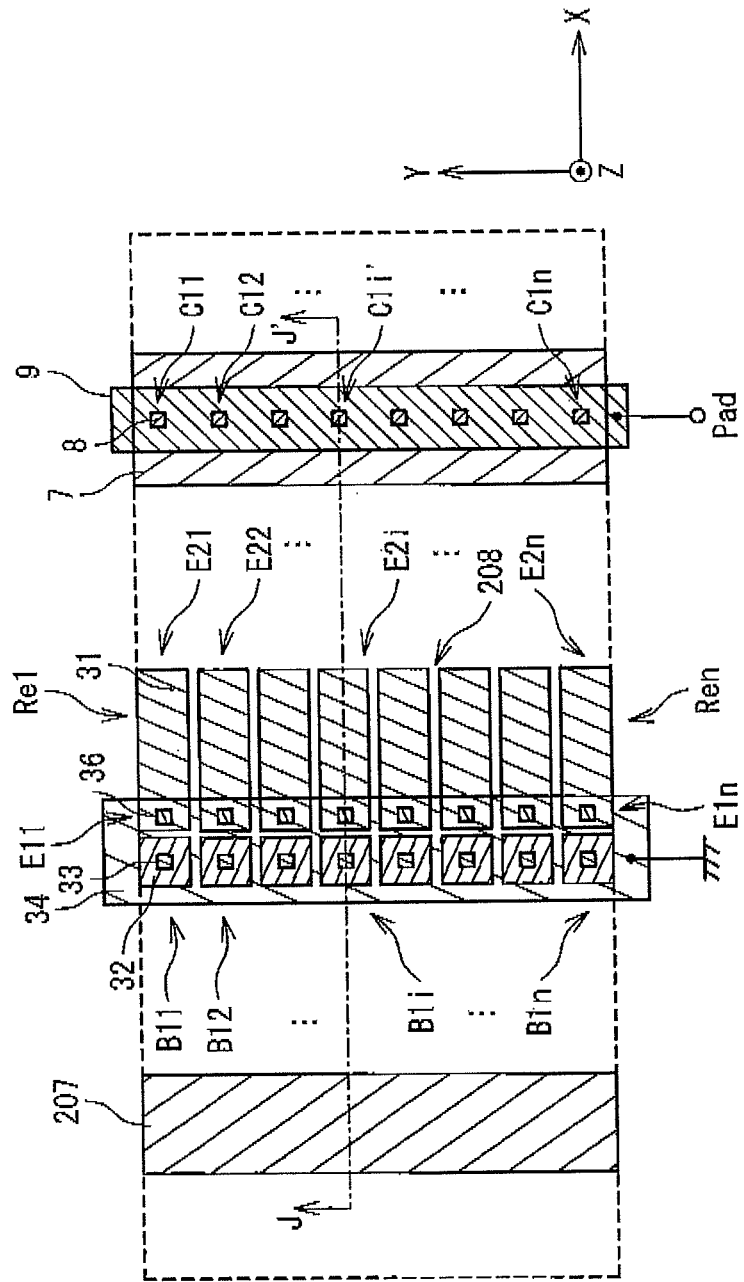
FIG. 20 is a plan view showing the structure of the ESD protection element according to a sixth embodiment of the present invention.
Figure 21:
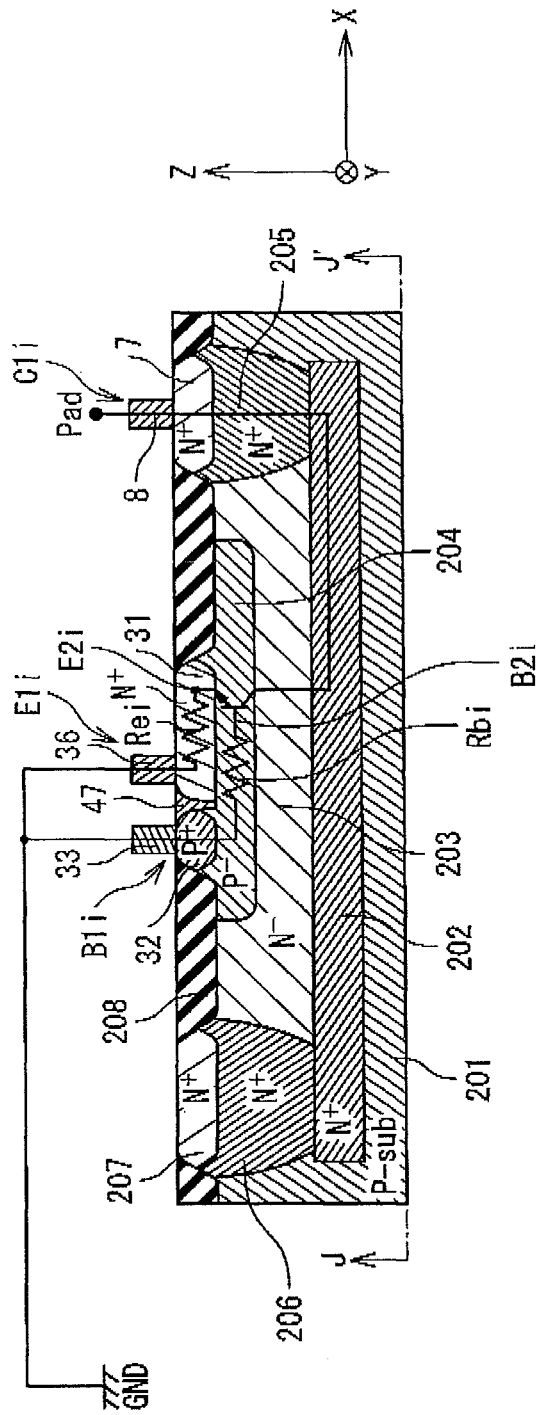
FIG. 21 is a cross sectional view showing a structure of the ESD protection element according to the sixth embodiment of the present invention along J-J' shown in FIG. 20.

FIG. 20 is a plan view showing the structure of the ESD protection element according to a sixth embodiment of the present invention. FIG. 21 is a cross sectional view showing the structure of the ESD protection element according to the sixth embodiment of the present invention along J-J' shown in FIG. 20. Referring to FIGS. 20 and 21, the ESD protection element according to the sixth embodiment of the present invention will be described based on the difference from the fifth embodiment. It should be noted that the silicide films 41 are omitted in FIG. 20 and structure of the wiring layers is omitted in FIG. 21.

According to the sixth embodiment, the $N^-$ emitter diffusion layers 31 and the $P^+$ base diffusion layers 32 are separately formed from each other, and contacts 33, 36 and 8 are formed on the $N^-$ emitter diffusion layers 31, the $P^+$ base diffusion layers 32 and the $N^+$ collector diffusion layer 7 without generating the silicide films. In the ESD protection element according to the present embodiment, the surge current flows via the contacts 36 formed on the $N^+$ emitter diffusion layers 31. More specifically, the $N^-$ emitter diffusion layers 31 and the $P^+$ base diffusion layers 32 are separated from each other by an element separation region 47 (e.g. an insulating film). The contacts 36 are formed on the $N^+$ emitter diffusion layers 31. The $N^+$ emitter diffusion layers 31 are connected to the metal wiring 34 via the contacts 36. The contacts 36 are preferably arranged adjacent to the contacts 33 on the $P^+$ base diffusion layers 32.

Referring to FIG. 21, when a high voltage is applied to the pad so that the ESD protection element is subjected to a bipolar operation, a current (i.e. surge current) flowing between the power supply voltage (e.g. ground (GND) voltage) and the collector terminals C11 to C1n flows from the contacts 36 (i.e. the emitter terminals E11 to E1n) to the collector side (i.e. the $N^+$ lead-out region 205) via the $N^+$ emitter diffusion layers 31 in a case of a flow of electrons. At this time, the electrons flow from the contacts 36 (i.e. the emitter terminals E11 to E1n) into the $N^+$ emitter diffusion layers 31, and then flow out from end portions (i.e. emitter regions E21 to E2n) of the $N^+$ emitter diffusion layers 31 on the collector side (i.e. the $N^+$ lead-out region 205) to the collector side. Therefore, a resistance component of the $N^+$ emitter diffusion layer 31 (i.e. a resistance Rei) from the contact 36 (i.e. the emitter terminal E1i) to the vicinity of the emitter region E2i on the collector side functions as a current control resistor for controlling a current amount of a collector current. It is therefore possible to prevent the surge current from being concentrated in the emitter terminal E1i. Other structures and operations are similar to those of the fifth embodiment.

According to the sixth embodiment, a resistance component (which is omitted in FIG. 17) of the contact 33 can be used as the current control resistor in the same manner as the fifth embodiment, so that a width of the $N^+$ emitter diffusion layers 31 (i.e. a length from the emitter terminal E1i to the emitter region E2i) can be made smaller than that of the fourth embodiment. It should be noted that the width of the $N^+$ emitter diffusion layers 31 is set, as needless to say, so as to allow the resistance Re1 to Ren to raise base voltages to a voltage in which a bipolar operation can be carried out.

By the above configuration, the ESD protection element according to the present embodiment can be shown by an equivalent circuit shown in FIG. 17.

[Seventh Embodiment]

Figure 22:
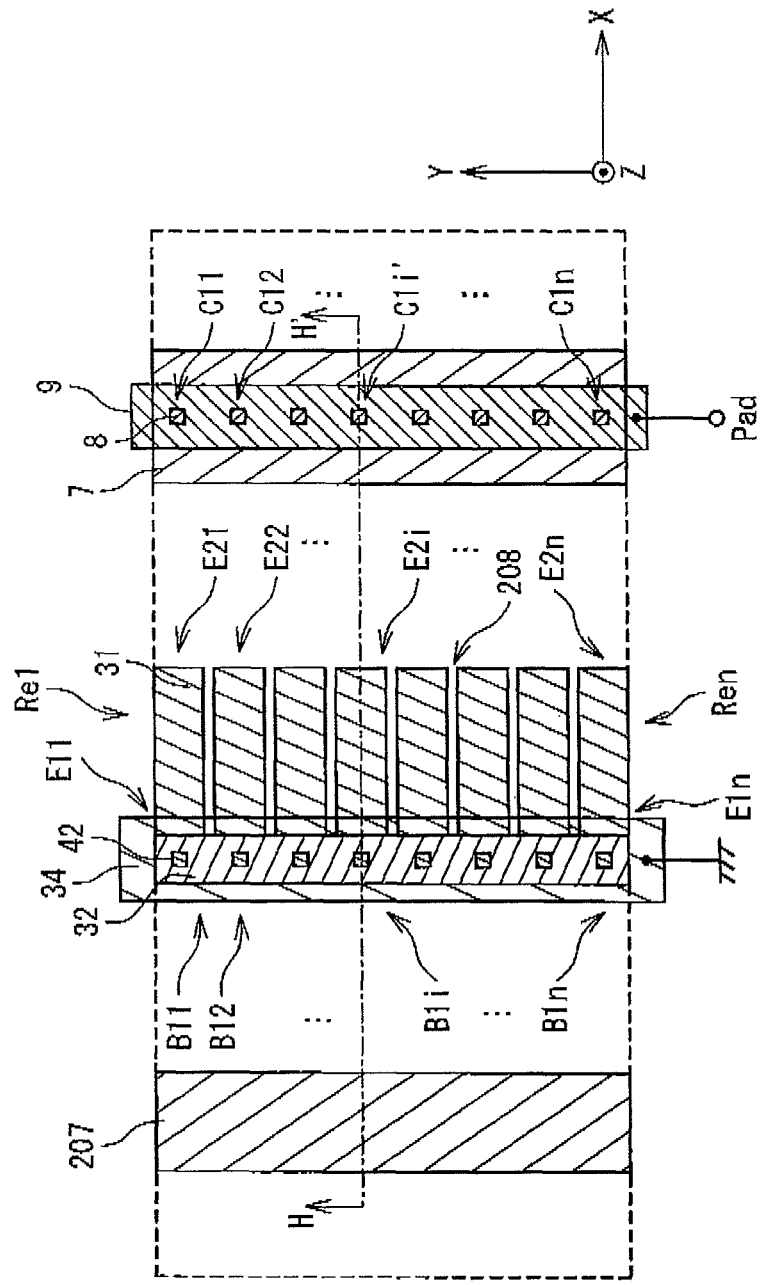
FIG. 22 is a plan view showing the structure of the ESD protection element according to a seventh embodiment of the present invention.

FIG. 22 is a plan view showing the structure of an ESD protection element according to a seventh embodiment of the present invention. As described above, the emitter diffusion layers separated in the base width direction (i.e. in the Y-axis direction) make it possible to prevent concentration of the surge current. However, the base diffusion layers do not necessarily need to be separated in the base width direction (i.e. in the Y-axis direction).

Referring to FIG. 22, the ESD protection element according to the seventh embodiment will be described. In the ESD protection element according to the seventh embodiment, the $P^+$ diffusion layers 32 in the fourth embodiment are formed to extend (without being separated) in the base width direction (i.e. in the Y-axis direction). Other structures are similar to those of the fourth embodiment. Accordingly, the $N^+$ emitter diffusion layers 31 are separated by the element separation region 208 in the same manner as the fourth embodiment. The cross sectional structure of the ESD protection element in the seventh embodiment along H-H' is similar to that of FIG. 16.

Figure 23:
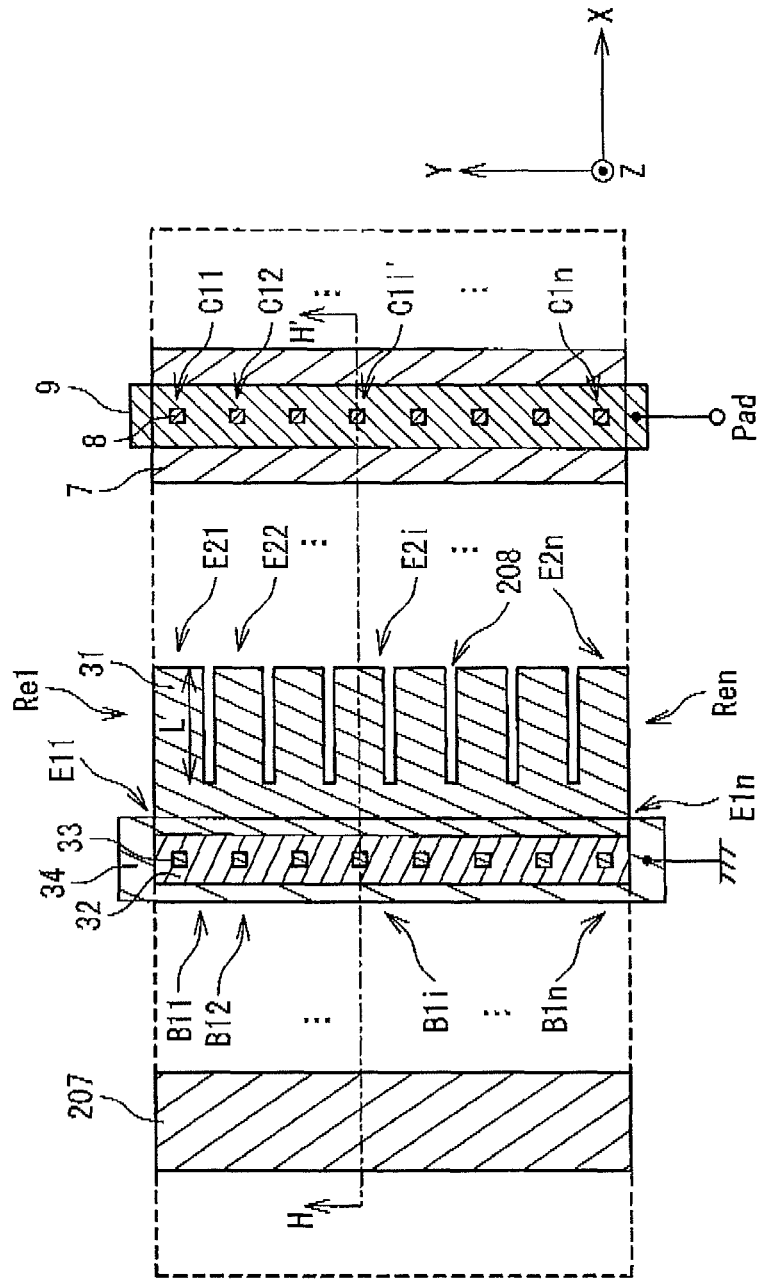
FIG. 23 is a plan view showing a modified example of the ESD protection element according to the seventh embodiment of the present invention.

FIG. 23 is a plan view showing a modification example of the seventh embodiment. The $N^+$ emitter diffusion layers 31 which are completely separated in the base width direction (i.e. in the Y-axis direction) in the ESD protection element shown in FIG. 22 may also have portions adjoined from each other. The ESD protection element shown in FIG. 23 includes an $N^+$ emitter diffusion layer of a comb shape in place of the $N^+$ emitter diffusion layers 31 in the ESD protection element shown in FIG. 22. The $N^+$ emitter diffusion layer is formed so as to extend as a unit body in a part and to be separated in another part in the base width direction (i.e. in the Y-axis direction). More specifically, in the $N^+$ emitter diffusion layer according to the present embodiment, regions adjacent to the base terminals B11 to B1i are formed to extend as the unit, body in the base width direction (i.e. in the Y-axis direction) and regions on a side of the contact terminals C11 to C1i are separated from each other by the element separation region 208. Here, a separated width L (i.e. a width in a direction perpendicular to the base width direction or the X-axis direction) is preferably set to such an extent that concentration of a surge current can be avoided.

The cross sectional structure of the ESD protection element along H-H' shown in FIG. 23 is similar to that of FIG. 16.

Even in the above structure, since the emitter terminals E11 to E1n are separated from each other, the surge current paths are separated, and the resistance component (i.e. the resistance Re1) of the silicide film 41 is used as the current control resistor. It is therefore possible to prevent concentration of the surge current. Although the seventh embodiment has been described by using an example in which a resistance component of the silicide film is used as the current control resistor, it is applicable to a case of using the resistance component of the diffusion layer as the current control resistor by arranging contacts on the emitter diffusion layer without providing the silicide film (i.e. sixth embodiment).

The ESD protection element according to the present embodiment can be shown by the equivalent circuit shown in FIG. 17.

Figure 24:
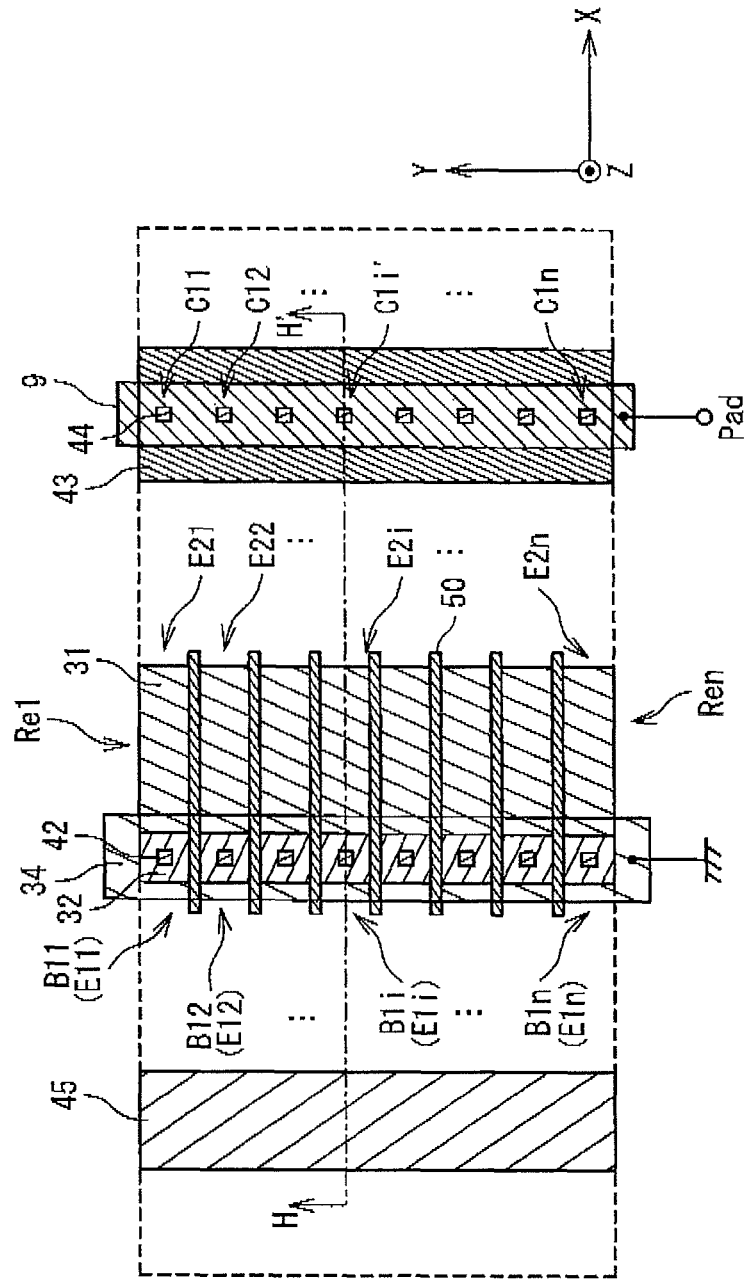
FIG. 24 is a plan view showing a modified example of the structure of the ESD protection element according to the fourth embodiment of the present invention.

Although each of the emitter diffusion layers and the base diffusion layers in the ESD protection element according to the fourth to seventh embodiments are separated in the base width direction (i.e. in the Y-axis direction) by the element separation region 208, they may be separated by other methods. For example, as shown in FIG. 24, in the forth embodiment, each of the diffusion layers may be separated from each other by a polysilicon gate 50 in place of the element separation region. An element separation method by the polysilicon gate 50 is similar to that of the third embodiment so that explanation thereof will be omitted.

The ESD protection circuit according to eighth and ninth embodiments for protecting the internal circuit from the surge current flowing in the power supply voltage (e.g. ground (GND) voltage) at the time of ESD application without a current flowing in an ordinary operation will be described if not only a plus voltage but also a minus high voltage is applied to the pad.

[Eighth Embodiment]

Figure 25:
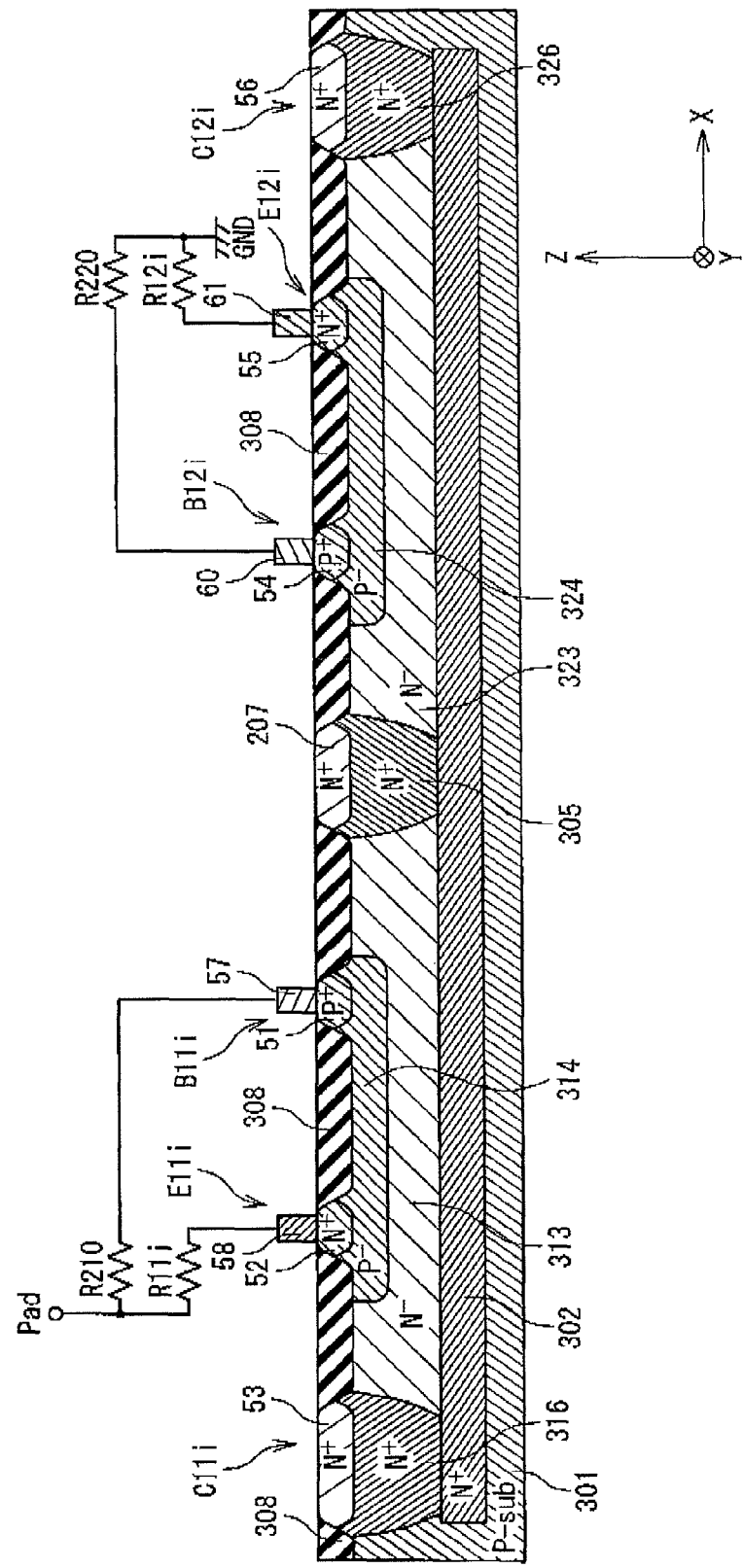
FIG. 25 is a cross sectional view showing the structure of the ESD protection element according to an eighth embodiment of the present invention.

FIG. 25 is a cross sectional view showing the structure of the ESD protection element according to the eighth embodiment of the present invention. Referring to FIG. 25, the structure and operation of the ESD protection element according to an eighth embodiment of the present invention will be described.

In the ESD protection element according to the eighth embodiment, the ESD protection element (i.e. transistor structure) according to the first embodiment is arranged symmetrically on the power supply voltage (e.g. ground (GND) voltage) side and a pad side. Referring to FIG. 25, in the ESD protection element according to the eighth embodiment, an $N^+$ embedded layer 302 is formed on a P-type substrate (i.e. P-sub) 301 in a Z-axis direction, and $N^+$ lead-out regions 305, 316 and 326 and $N^-$ collector regions 313 and 323 are formed on the $N^+$ embedded layer 302. The $N^-$ collector region 313 is formed between the $N^+$ lead-out region 305 and the $N^+$ lead-out region 316, and a $P^-$ base region 314 is formed on the $N^-$ collector region 313 in the Z-axis direction to function as a base region. The $N^-$ collector region 323 is formed between the $N^+$ lead-out region 305 and the $N^+$ lead-out region 326, and a $P^-$ base region 324 is formed on the $N^-$ collector region 323 in the Z-axis direction to function as a base region.

On the $P^-$ base region 314, a $P^+$ base diffusion layer 51 and a contact 57 functioning as a base terminal B110 in a bipolar operation and an emitter diffusion layer 52 and a contact 58 functioning as an emitter terminal E11i are formed. Also, an $N^+$ collector diffusion layer 53 is formed on the $N^+$ lead-out region 316 to function as a collector terminal C110. Further, an $N^+$ diffusion layer 207 is formed on the $N^+$ lead-out region 305. The $N^+$ diffusion layer 207, the $P^+$ base diffusion layer 51, the $N^+$ emitter diffusion layer 52 and the $N^+$ collector diffusion layer 53 are separated from each other by an element separation region 308 (e.g. an insulating film).

On the $P^-$ base region 324, a $P^+$ base diffusion layer 54 and a contact 60 functioning as a base terminal B120 in a bipolar operation, and an $N^+$ emitter diffusion layer 55 and a contact 61 functioning as an emitter terminal E12i are formed. Also, an $N^+$ collector diffusion layer 56 is formed on the $N^+$ lead-out region 326 to function as a collector terminal C120. The $N^+$ diffusion layer 207, the $P^+$ base diffusion layer 54, the $N^+$ emitter diffusion layer 55, and the $N^+$ collector diffusion layer 56 are separated from each other by the element separation region 308 (e.g. the insulating film).

The $P^+$ base diffusion layer 51 is connected to one end of a resistance R210 via the contact 57. The $N^+$ emitter diffusion layer 52 is connected to one end of a current control resistor R11i via the contact 58. The other end of the resistor R210 and the other end of the current control resistor R11i are commonly connected to a pad. Meanwhile, the $P^+$ base diffusion layer 54 is connected to one end of a resistor R220 via the contact 60. The $N^+$ emitter diffusion layer 55 is connected to one end of a current control resistor R12i via the contact 61. The other end of the resistor R220 and the other end of the current R12i are commonly connected to the power supply voltage (e.g. ground (GND) voltage).

By the above structure, the emitter terminal E11i of the transistor is connected to the pad via the current control resistor R11i and the base terminal B110 thereof is connected to the pad via the resistor R210. The emitter terminal E12i of the transistor is grounded via the current control resistor R12i, and the base terminal B120 thereof is grounded via the resistor R220, and the collector terminal C120 is connected to the collector terminal C110 of the transistor on the pad side via the $N^+$ embedded layer 302.

A plurality of structures described above are provided in the same manner as the first embodiment, so that current paths are distributed for the surge current flowing into the ESD protection element.

When a plus voltage is applied to the pad, a diode formed by the $P^-$ base region 314 and the $N^-$ collector region 313 is biased in a forward direction, and a diode formed by the $P^-$ base region 324 and the $N^-$ collector region 323 is biased in a reverse direction. Here, if the plus voltage equal to or higher than a breakdown voltage of the diode formed by the $P^-$ base region 324 and the $N^-$ collector region 323 is applied to the pad, a current flows from the pad to the power supply voltage (e.g. ground (GND) voltage) via the resistors R210 and R220. Therefore, a voltage in the base terminal B120 is increased due to a voltage drop by the resistor R220, and the transistor on the side of the power supply voltage (e.g. ground (GND) voltage) is operated such that the surge current to start flowing between the pad and the power supply voltage (e.g. ground (GND) voltage). At this time, the surge current flows from the pad to the power supply voltage (e.g. ground (GND) voltage) via the $N^-$ collector region 323, the $P^-$ base region 324, the $N^+$ emitter diffusion layer 55 and the current control resistor R12i.

In contrast, when a minus voltage is applied to the pad, the diode formed by the $P^-$ base region 314 and the $N^-$ collector region 313 is biased in the reverse direction, and the diode formed by the $P^-$ base region 324 and the $N^-$ collector region 323 is biased in the forward direction. Here, if the minus voltage equal to or less than a breakdown voltage of the diode formed by the $P^-$ base region 314 and the $N^-$ collector region 313 is applied to the pad, a current flows from the power supply voltage (e.g. ground (GND) voltage) to the pad via the resistors R210 and R220. Therefore, a voltage of the base terminal B110 is increased due to a voltage drop by the resistor R210, and the transistor on the side of the pad is operated so that the surge current starts flowing between the pad and the power supply voltage (e.g. ground (GND) voltage). At this time, the surge current flows from the power supply voltage (e.g. ground (GND) voltage) to the pad via the $N^-$ collector region 313, the $P^-$ base region 314, the $N^+$ emitter diffusion layer 52 and the current control resistor R11i.

As described above, the surge current (or ESD current) flows via the transistor on the side of the power supply voltage (e.g. ground (GND) voltage) and a plurality of current control resistors R12i, whereby current concentration in the transistor of the ESD protection element can be avoided. This effect is similarly observed in the transistor on the pad side.

[Ninth Embodiment]

Figure 26:
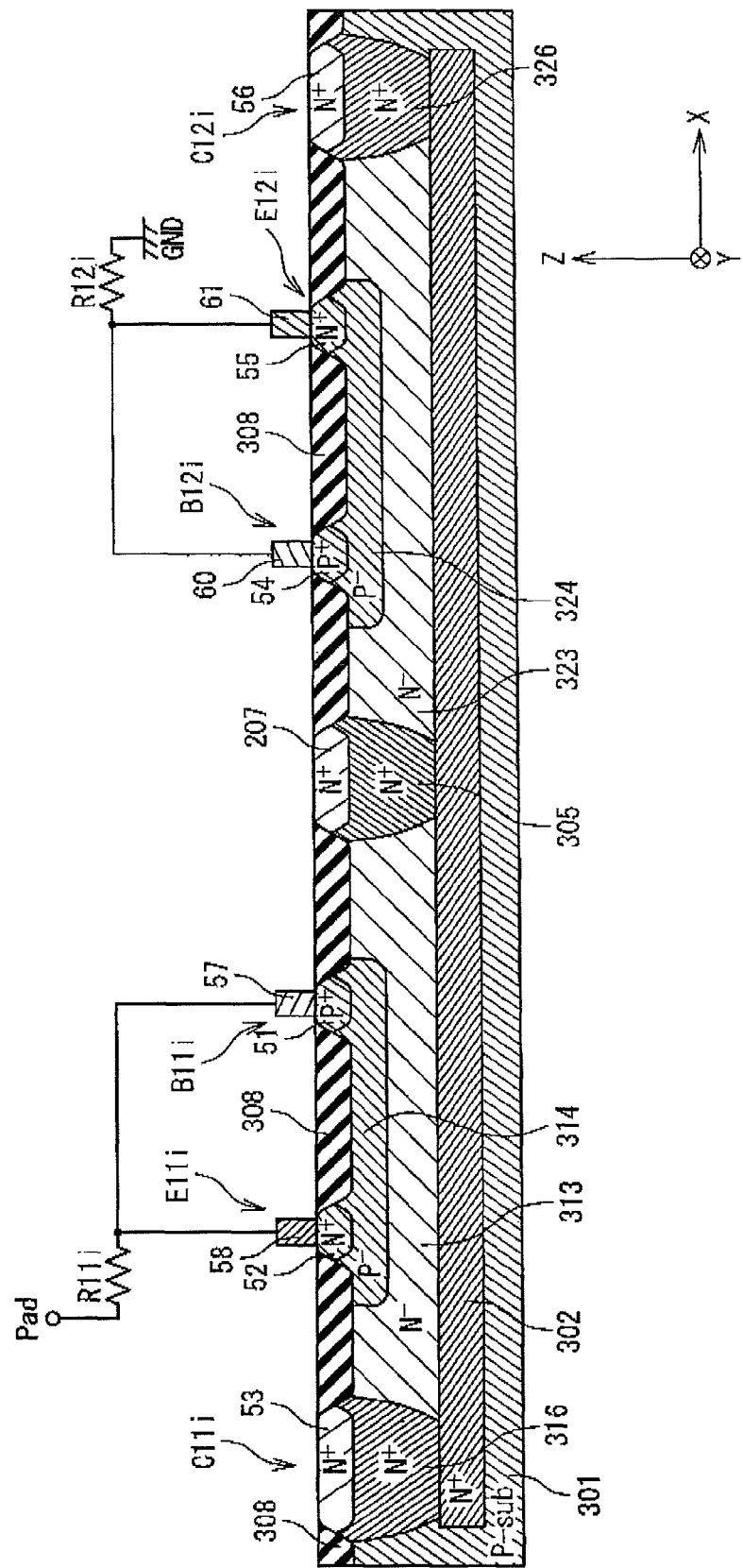
FIG. 26 is a cross sectional view showing the structure of the ESD protection element according to a ninth embodiment of the present invention.

FIG. 26 is a cross sectional view showing the structure of the ESD protection element according to a ninth embodiment of the present invention. Referring to FIG. 26, the structure and operation of the ESD protection element according to the ninth embodiment of the present invention will be described. In the ESD protection element according to the ninth embodiment, the ESD protection element (i.e. transistor structure) in the second embodiment is arranged symmetrically on the power supply voltage (e.g. ground (GND) voltage) side and a pad side.

Referring to FIG. 26, the $P^+$ base diffusion layer 51 and the contact 57 functioning as a base terminal B11i are connected to a current control resistor R11i. The $P^-$ base diffusion layer 54 and the contact 60 functioning as a base terminal B12i are connected to the current control resistor R12i. Other structures are similar to those of the eighth embodiment. A plurality of structures described above are provided in the same manner as the second embodiment, whereby current paths are distributed for the surge current flowing in the ESD protection element.

When a plus voltage is applied to the pad, a diode formed by the $P^-$ base region 314 and the $N^-$ collector region 313 is biased in a forward direction, and a diode formed by the $P^-$ base region 324 and the $N^-$ collector region 323 is biased in a reverse direction. Here, if the plus voltage equal to or more than a breakdown voltage of the diode formed by the $P^-$ base region 324 and the $N^-$ collector region 323 is applied to the pad, a current flow from the pad to the power supply voltage (e.g. ground (GND) voltage) via the resistor R11i and the resistor R12i. Therefore, a voltage of the base terminal B12i is increased due to a voltage drop by the current control resistor R12i, and the transistor on the side of the power supply voltage (e.g. ground (GND) voltage) is operated so that the surge current starts flowing from the pad to the power supply voltage (e.g. ground (GND) voltage). At this time, the surge current flows from the pad to the power supply voltage (e.g. ground (GND) voltage) via the $N^-$ collector region 323, the $P^-$ base region 324, the $N^+$ emitter diffusion layer 55 and the current control resistor R12i.

In contrast, when a minus voltage is applied to the pad, the diode formed by the $P^-$ base region 314 and the $N^-$ collector region 313 is biased in the reverse direction, and the diode formed by the $N^-$ base region 324 and the $N^-$ collector region 323 is biased in the forward direction. Here, if the minus voltage equal to or less than a breakdown voltage of the diode formed by the $P^-$ base region 314 and the $N^-$ collector region 313 is applied to the pad, the current flows from the power supply voltage (e.g. ground (GND) voltage) to the pad via the resistor R12i and the resistor R11i. Therefore, the voltage of the base terminal B11i is increased due to a voltage drop by the current control resistor R11i, and the transistor on the side of the pad is operated so that the surge current starts flowing from the power supply voltage (e.g. ground (GND) voltage) to the pad.

As described above, the surge current (or ESD current) flows via the transistor on the side of the power supply voltage (e.g. ground (GND) voltage) and the plurality of current control resistors R12i, whereby current concentration in the transistor in the ESD protection element can be avoided. This effect is similarly observed in the transistor on the pad side. Even if a plus or minus large amplitude voltage is applied thereto, the large amplitude voltage is not applied to the transistors in the ESD protection element of the present embodiment, so that it is possible to avoid element destruction.

Figure 27:
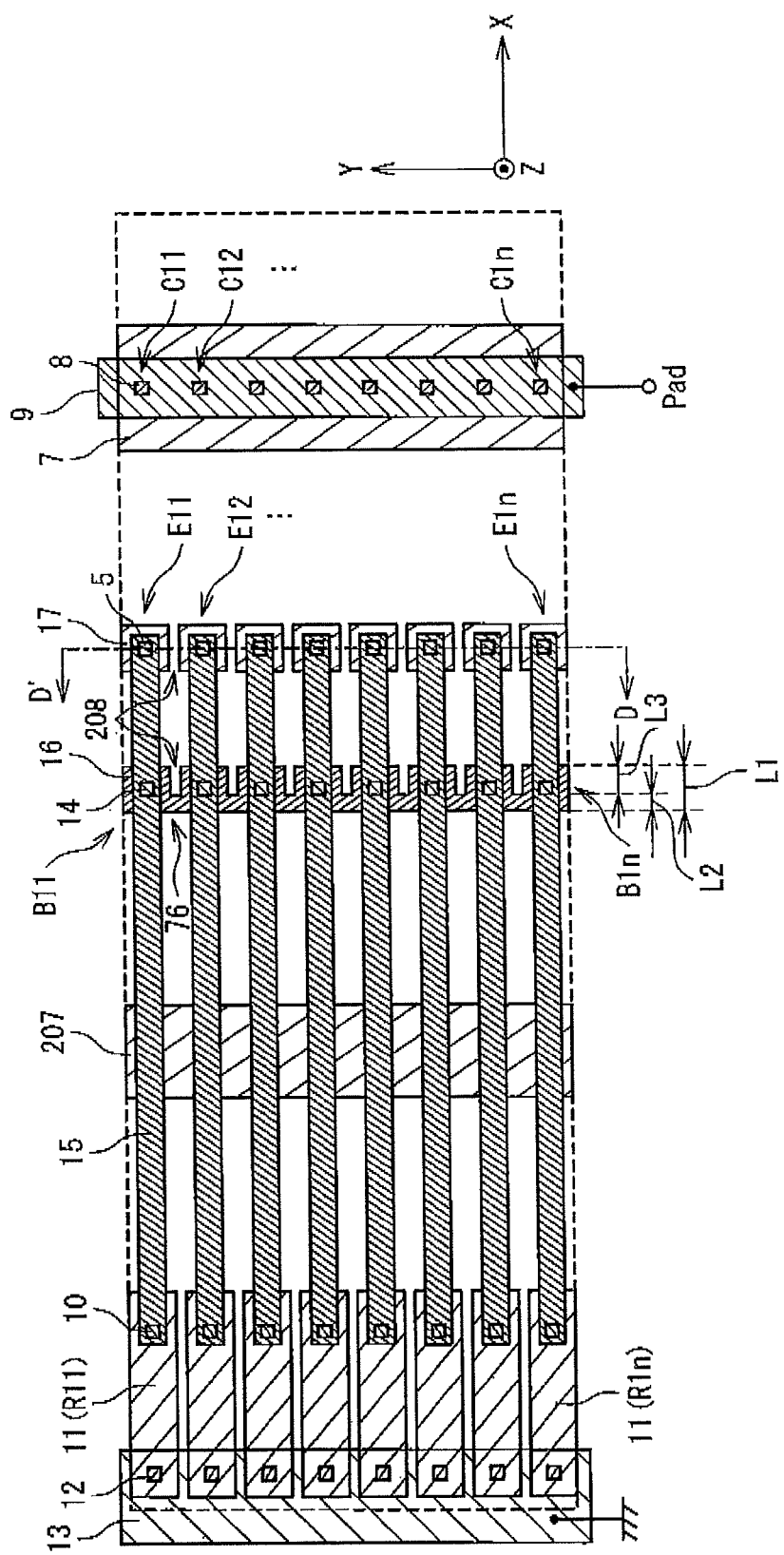
FIG. 27 is a plan view showing the structure of a modification of the ESD protection element according to the third embodiment of by the present invention.

FIG. 27 is a plan view showing structure of a modification example of the ESD protection element according to the third embodiment of this invention. Referring to FIG. 27, a modification example of the ESD protection element in the third embodiment will be described. Although the $P^+$ diffusion layers 16 are separately provided in the base width W direction (i.e. in the Y-axis direction) in the ESD protection element of the third embodiment, the $P^+$ diffusion layers 16 are connected to each other by the $P^+$ base diffusion layer 76 in the ESD protection element shown in FIG. 27. The other structure is same as the third embodiment.

In detail, the $P^+$ base diffusion layers 16 in this example have a portion with a width L3 in which the $P^+$ base diffusion layers 16 are partially separated by the element separation region 208 and a portion with a width L2 in which the $P^+$ base diffusion layers 16 are continuously connected to each other in the based width direction by the $P^+$ base diffusion layer 76. Here, the widths L2 and L3 are the widths in the direction perpendicular to the base width direction (i.e. in the X-axis direction). The width L2 is desirable to be smaller than the width L1 of the $P^+$ base diffusion layer 16 in the X-axis direction. Also, the width L3 is desirable to be set to the size to an extent that the concentration of the surge current can be avoided. Therefore, the width L3 is desirable to be larger than the width L2.

Figure 28:
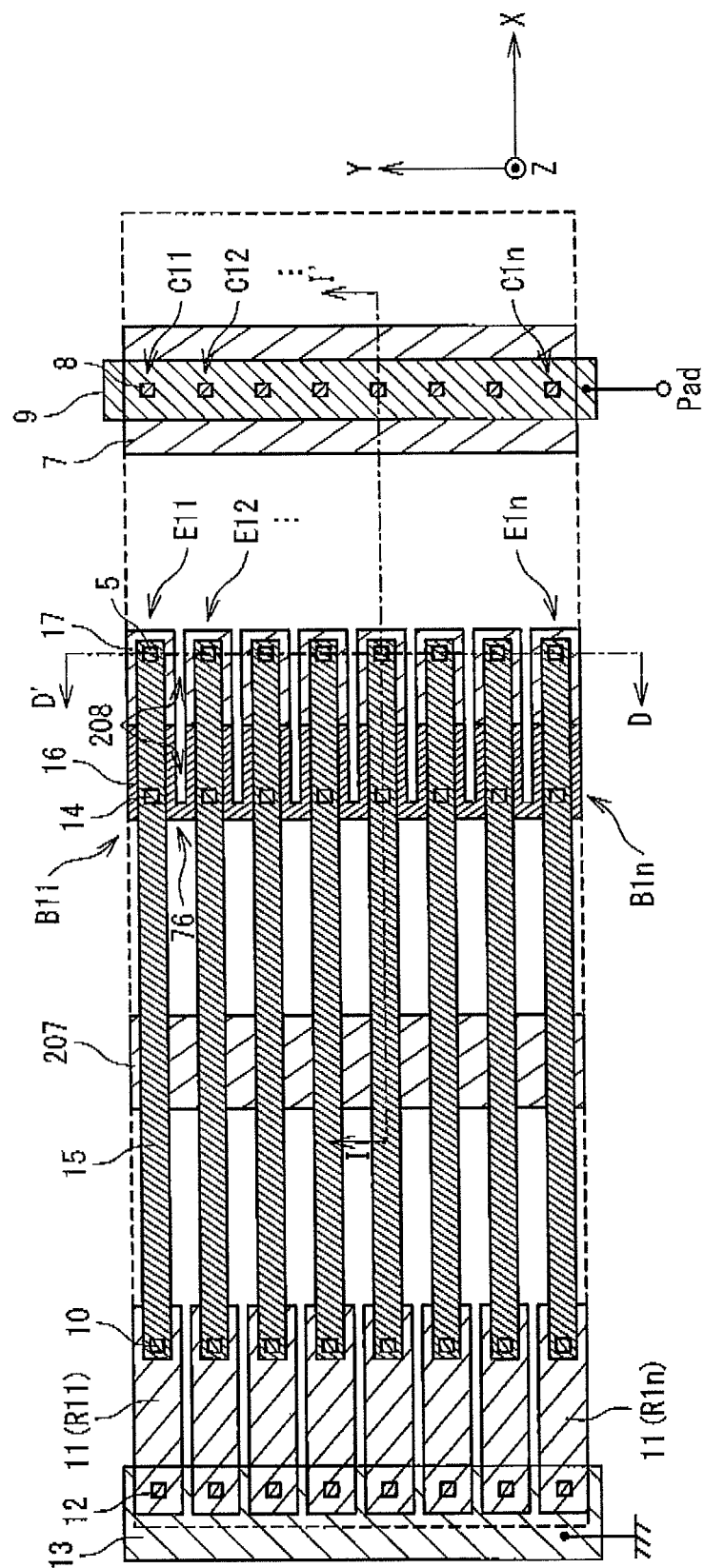
FIG. 28 is a plan view showing a structure of a modification of the ESD protection element shown in FIG. 27.
Figure 29:
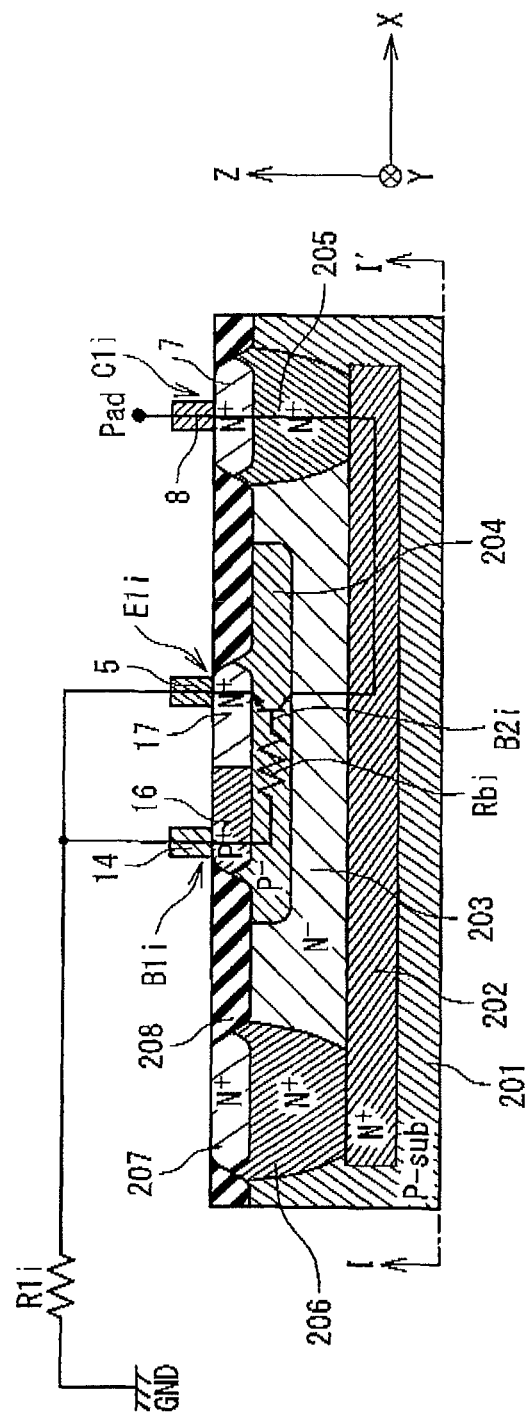
FIG. 29 is a cross sectional view of the ESD protection element along the line I-I' shown in FIG. 28.

FIG. 28 is a plan view showing the structure of a modification example of the ESD protection element shown in FIG. 27. FIG. 29 is a cross sectional view of the ESD protection element along I-I' section shown in FIG. 28. Referring to FIGS. 28 and 29, the modification example of the ESD protection element shown in FIG. 27 will be described. In the ESD protection element shown in FIG. 27, the $N^+$ emitter diffusion layers 17 and the $P^+$ base diffusion layers 16 are separated by the element separation region 208 into the X-axis direction. However, in the ESD protection element shown in FIG. 28, the $N^+$ emitter diffusion layers 17 and the $P^+$ base diffusion layers 16 are in contact with each other. That is, in the ESD protection element of this example, the element separation region 208 between the $N^+$ emitter diffusion layers 17 and the $P^+$ base diffusion layer 16 in the X-axis direction is removed, and both shows a batting structure which both are connected by a heterojunction.

When noise is received by the collector, a current due to the noise flows into junction capacitance (Ccb) and then flows to the power supply voltage (e.g. ground (GND) voltage) through the base. At this time, the noise current flows through base resistance Rbi to generate a voltage drop such that the voltage of the base B2i (the base voltage) varies. In this case, the variation in the voltage of the base B2i is (noise current)× Rbi; which becomes larger as the base resistance Rbi becomes larger. Also, the time period during which the change in the voltage of the base B2i (the base voltage) at this time continues is determined based on Rbi×Ccb. If a diode composed of the emitter and the base is not turned on, any current does not flow through the emitter. However, when a time period during which the base voltage is higher than the emitter voltage because of the noise is equal to or longer than a time period required for the bipolar transistor to operate, the bipolar transistor becomes a conductive state. In order to avoid the bipolar operation due to the noise, a distance between the $N^+$ emitter diffusion layer 17 and the $P^+$ base diffusion layer 16 in this example is made shorter than that of the third embodiment, so that a current path between the $N^+$ emitter diffusion layer 17 and the $P^+$ base diffusion layer 16 through the P⁻ base region 204 is made short, resulting in that the resistance Rbi of the P⁻ base region 204 become small. As a result, (noise current)×Rbi and Rbi×Ccb become small and the start of the bipolar operation due to the noise is restrained.

In this way, by shortening the distance between the N⁺ emitter diffusion layer 17 and the P⁺ base diffusion layer 16, a risk that the bipolar transistor operates due to the noise can be reduced. It should be noted that it is not always necessary to join the N⁺ emitter diffusion layer 17 and the P⁺ base diffusion layer 16 for such an effect. For example, in the third embodiment, the similar effect can be attained by shortening the width of the element separation region 208 between the emitter and the base.

Figure 30:
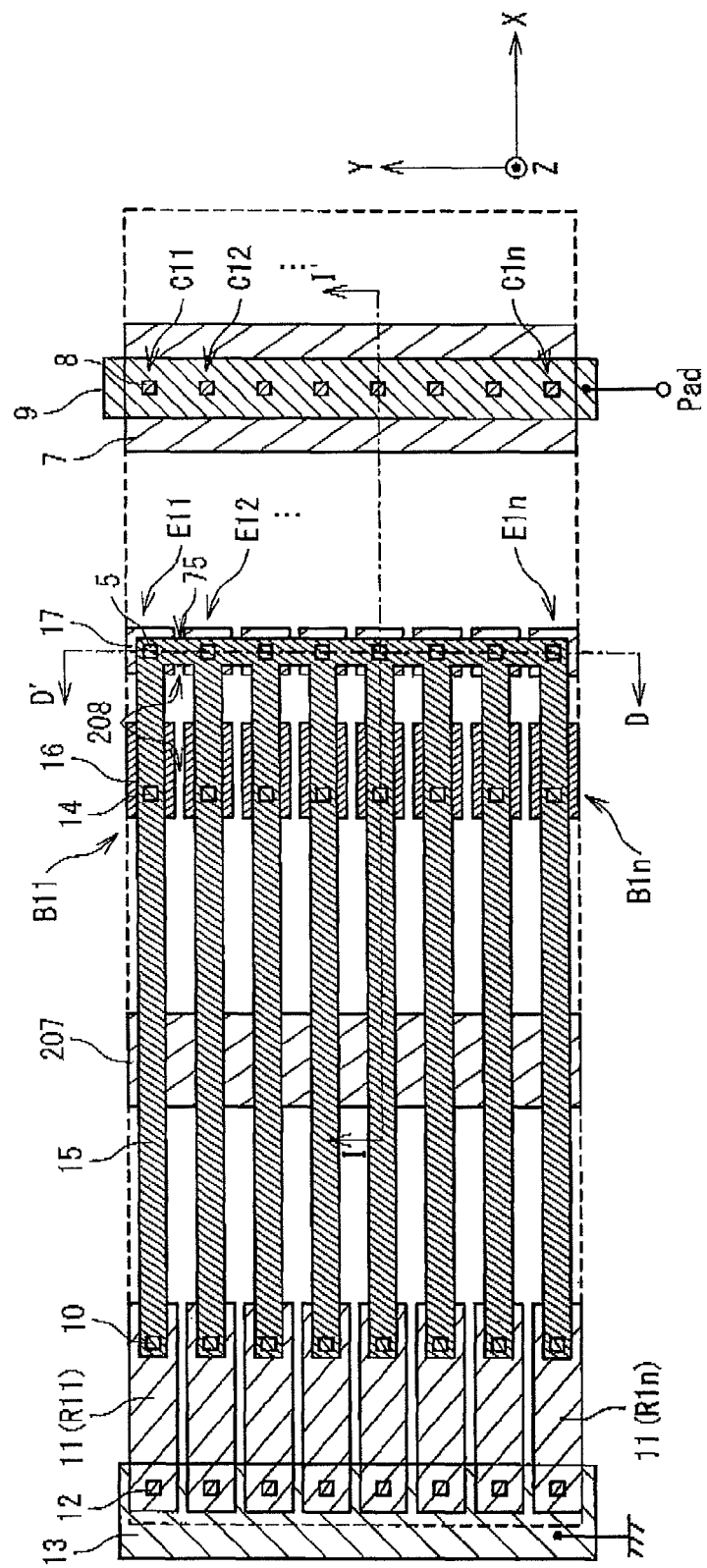
FIG. 30 is a plan view showing a structure of another modification of the ESD protection element according to the third embodiment of the present invention.

FIG. 30 is a plan view showing the structure of the other modification example in the third embodiment. Referring to FIG. 30, another modification example of the third embodiment will be described. In the ESD protection element of the third embodiment, a plurality of metal wirings 15 separated from each other in the base width W direction (i.e. in the Y-axis direction) are connected by a metal wiring 75 on the N⁺ emitter diffusion layer 17. The other structure is same as that of the third embodiment.

In the ESD protection element shown in FIG. 30, the metal wiring 75 which connects the metal wirings 15 in the Y-axis direction on the emitter functions as a thermal capacitance to absorb heat generated by the ESD pulse current, whereby to attain the effect that the ESD protection performance is improved.

Although the various embodiments of the present invention have been described, specific structures are not limited to the above examples, and any modifications without going beyond the gist of the present invention are included within the present invention. The first to ninth embodiments can be combined in a range of no technical contradiction. For example, the base diffusion layer and the emitter diffusion layer in the first embodiment may be separated in the same manner as the third embodiment. The power supply voltage may be set to a different voltage other than the ground voltage. The present invention can be further applicable to an ESD protection element using a lateral PNP bipolar transistor and a lateral NPN bipolar transistor.

What is claimed is:

1. An ESD (Electrostatic Discharge) protection element comprising:
   a bipolar transistor comprising:
     a collector diffusion layer connected with a first terminal;
     a base diffusion layer; and
     an emitter diffusion layer;
   a first wire connected to the emitter diffusion layer and the base diffusion layer;
   a second wire connected to the emitter diffusion layer and the base diffusion layer;
   a first current control resistance connected to a second terminal, and connected to the first wire by a first contact;
   a second current control resistance connected to the second terminal, and connected to the second wire by a second contact,
   wherein the collector diffusion layer and the emitter diffusion layer are each arranged in a base width direction,
   the first and second wires and the first and second current control resistances are each arranged in a direction that is perpendicular to the base width direction, and
   wherein current flowing out to a power supply voltage is distributed to flow through the first and second current control resistances in order to reduce current concentration in a breakdown path.

2. The ESD protection element according to claim 1, wherein the base diffusion layer of said bipolar transistor is connected with said second terminal through a first resistance which is different from said first and second current control resistances.

3. The ESD protection element according to claim 2, wherein said emitter diffusion layer further comprises a plurality of third contacts connected with said second terminal through said first and second current control resistances, respectively, and
   said base diffusion layer further comprises a plurality of fourth contacts connected with said second terminal through a plurality of said first resistances.

4. The ESD protection element according to claim 1, wherein the base diffusion layer is connected with said second terminal through said first and second current control resistances, respectively.

5. The ESD protection element according to claim 4, wherein said emitter diffusion layer has a plurality of third contacts connected with said second terminal through said first and second current control resistances, respectively, and
   wherein said base diffusion layer has a plurality of fourth contacts connected with said second terminal through said first and second current control resistances, respectively.

6. The ESD protection element according to claim 2, wherein said emitter diffusion layer comprises a plurality of emitter diffusion sub layers, in each of which at least one contact is formed.

7. The ESD protection element according to claim 6, wherein said base diffusion layer comprises a plurality of base diffusion sub layers, in each of which at least one contact is formed.

8. The ESD protection element according to claim 6, wherein said base diffusion layer is partially separated in a base width direction by an element separation region.

9. The ESD protection element according to claim 7, wherein said emitter diffusion layer and said base diffusion layer are in contact with each other.

10. The ESD protection element according to claim 7, wherein said plurality of emitter diffusion sub layers are connected with said plurality of base diffusion sub layers through a plurality of wirings, respectively, the plurality of wirings including the first and second wires.

11. The ESD protection element according to claim 1, wherein said first and second current control resistances are formed from resistance components of said emitter diffusion layer.

12. The ESD protection element according to claim 1, further comprising a silicide film formed on said emitter diffusion layer,
   wherein said current adjustment, and
   wherein said first and second current control resistances are formed from resistance components of said silicide film.

13. The ESD protection element according to claim 11, wherein at least a part of said emitter diffusion layer is separated in a base width direction by an element separation region.

14. The ESD protection element according to claim 11, wherein said bipolar transistor further comprises a base diffusion layer connected with said second terminal through a second contact, wherein said emitter diffusion layer is provided between said base diffusion layer and said collector diffusion layer, wherein said base diffusion layer and said emitter diffusion layer are adjacent to each other in a direction perpendicular to the base width direction, and wherein a length of said emitter diffusion layer from an end thereof on a side of said collector diffusion layer to an end thereof on a side of said base diffusion layer is set to a predetermined length.

15. The ESD protection element according to claim 14, wherein said emitter diffusion layer has a third contact configured to connect said emitter diffusion layer and said second terminal, and wherein said third contact is formed on an end of said emitter diffusion layer on a side of said fourth contact.

16. The ESD element protection element according to claim 15, wherein a first bipolar transistor comprises a first emitter diffusion layer and a first base diffusion layer which are connected with said first terminal in common through a first current control resistance; and a second bipolar transistor comprises a second emitter diffusion layer and a second base diffusion layer which are connected with said second terminal in common through a second current control resistance, wherein said first bipolar transistor and said second bipolar transistor are connected through a collector region, wherein said first current control resistance is provided for a plurality of current paths from said first terminal to said collector region through said first emitter diffusion layer, and wherein said second current control resistance is provided for a plurality of current paths from said second terminal to said collector region through said first emitter diffusion layer.

17. The ESD protection element according to claim 16, wherein said bipolar transistor is a vertical-type NPN bipolar transistor.

18. An ESD (Electrostatic Discharge) protection element comprising:
a bipolar transistor comprising:
a collector diffusion region connected with a first terminal;
a base diffusion region; and
an emitter diffusion region;
a first wire connected to the emitter diffusion region and the base diffusion region;
a second wire connected to the emitter diffusion region and the base diffusion region;
a first current control resistance connected to a second terminal, and connected to the first wire by a first contact;
a second current control resistance connected to the second terminal, and connected to the second wire by a second contact,
wherein the first and second wires each provide a separate current path from the second terminal to the collector diffusion layer through the emitter layer, and
wherein current flowing out to a power supply voltage is distributed to flow through the first and second control resistances in order to reduce current concentration in a breakdown path.

19. The ESD protection element according to claim 18, wherein the base diffusion region is connected with said second terminal through a base resistance which is different from said first and second current control resistances.

20. The ESD protection element according to claim 18, wherein a plurality of third contacts is provided for said emitter diffusion region to be connected with said second terminal through said of first and second current control resistances, respectively.

21. The ESD protection element according to claim 20, wherein a plurality of fourth contacts is provided for said base diffusion region to be connected with said second terminal through said first second current control resistances, respectively.

22. The ESD protection element according to claim 18, wherein said emitter diffusion region comprises a plurality of emitter diffusion subregions which are respectively connected with said second terminal through said first and second current control resistances.

23. The ESD protection element according to claim 22, wherein a plurality of fourth contacts is provided for said base diffusion region to be connected with said second terminal through said first and second current control resistances, respectively.

24. The ESD protection element according to claim 22, wherein said base diffusion region comprises a plurality of base diffusion subregions which are respectively connected with said second terminal through base resistances.

25. The ESD protection element according to claim 24, wherein said first and second current control resistances are resistance components of said plurality of emitter diffusion subregions, respectively.

26. The ESD protection element according to claim 24, further comprising:
a base region layer extending from a portion under said base diffusion region to a portion under said emitter diffusion region; and
wherein said base resistances are resistance components of said base region layer.

27. The ESD protection element according to claim 24, further comprising:
a plurality of silicide films, each of which is formed on one of said plurality of emitter diffusion subregions and a corresponding one of said a plurality of base diffusion subregions; and
a base region layer extending from a portion under said base diffusion region to a portion under said emitter diffusion region,
wherein said first and second current control resistances are resistance components of said plurality of silicide films, and
wherein said base resistances are resistance components of said base region layer.

28. The ESD protection element according to claim 1, further comprising a common wiring connected to each of the first and second current control resistances and the second terminal.

29. The ESD protection element according to claim 28, wherein the common wiring distributes a current to each of the first and second current control resistances, in response to the current flowing to the second terminal.

30. An ESD (Electrostatic Discharge) protection element comprising:
a bipolar transistor comprising:
a collector diffusion layer connected with a first terminal;
a base diffusion layer; and
an emitter diffusion layer;
a plurality of wires each connected to the emitter diffusion layer and the base diffusion layer; and a plurality of current control resistances each of which is connected to a second terminal and a respective wire of the plurality of wires, wherein the collector diffusion layer and the emitter diffusion layer are each arranged in a base width direction, the plurality of wires and the plurality of current control resistances are each arranged in a direction that is perpendicular to the base width direction, and wherein current flowing out to a power supply voltage is distributed to flow through the plurality of current control resistances in order to reduce current concentration in breakdown path.

* * * * *

UNITED STATES PATENT AND TRADEMARK OFFICE
CERTIFICATE OF CORRECTION

| | |
|---|---|
| PATENT NO. | : 8,860,139 B2 |
| APPLICATION NO. | : 12/722000 |
| DATED | : October 14, 2014 |
| INVENTOR(S) | : Kouichi Sawahata |

It is certified that error appears in the above-identified patent and that said Letters Patent is hereby corrected as shown below:

In the Specification

Column 3, Line 24: Delete "ESP" and insert -- ESD --

Column 5, Line 42: Delete "the" and insert -- the $N^+$ --

Column 7, Line 45: Delete "C1i" and insert -- C11 --

Column 11, Line 30: Delete "(CND)" and insert -- (GND) --

Column 17, Line 51: Delete "an" and insert -- $N^+$ --

In the Claims

Column 22, Line 15: In Claim 3, after "layer" delete "further"

Column 22, Line 67: In Claim 14, delete "second" and insert -- fourth --

Column 23, Line 18: In Claim 16, after "ESD" delete "element"

Column 23, Line 59: In Claim 16, delete "emitter" and insert -- emitter diffusion --

Column 23, Line 61: In Claim 18, delete "second" and insert -- second current --

Column 24, Line 4: In Claim 20, after "said" delete "of"

Column 24, Line 10: In Claim 21, delete "first" and insert -- first and --

Signed and Sealed this
Tenth Day of March, 2015

Michelle K. Lee
*Deputy Director of the United States Patent and Trademark Office*